(12) United States Patent
Lee et al.

(10) Patent No.: US 10,008,476 B2
(45) Date of Patent: Jun. 26, 2018

(54) STACKED SEMICONDUCTOR PACKAGE INCLUDING A SMALLER-AREA SEMICONDUCTOR CHIP

(71) Applicant: Samsung Electronics Co., Ltd., Suwon-si, Gyeonggi-do (KR)

(72) Inventors: Seok-chan Lee, Hwaseong-si (KR); Sung-hoon Chun, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 154 days.

(21) Appl. No.: 14/520,317

(22) Filed: Oct. 21, 2014

(65) Prior Publication Data

US 2015/0115438 A1  Apr. 30, 2015

(30) Foreign Application Priority Data

Oct. 28, 2013 (KR) ........................ 10-2013-0128722

(51) Int. Cl.
*H01L 23/02* (2006.01)
*H01L 23/52* (2006.01)
(Continued)

(52) U.S. Cl.
CPC .......... *H01L 25/0657* (2013.01); *H01L 24/29* (2013.01); *H01L 24/32* (2013.01);
(Continued)

(58) Field of Classification Search
CPC ..... H01L 25/0652; H01L 25/50; H01L 24/49; H01L 24/32; H01L 24/29; H01L 24/73;
(Continued)

(56) References Cited

U.S. PATENT DOCUMENTS

| 7,253,511 B2 * | 8/2007 | Karnezos | ................ H01L 25/03 257/686 |
| 2002/0180020 A1 * | 12/2002 | Lin | ................... H01L 23/49575 257/686 |

(Continued)

FOREIGN PATENT DOCUMENTS

| KR | 20080004731 A | 1/2008 |
| KR | 20120005340 | 1/2012 |

*Primary Examiner* — Kimberly Rizkallah
*Assistant Examiner* — Dilinh Nguyen
(74) *Attorney, Agent, or Firm* — Renaissance IP Law Group LLP

(57) ABSTRACT

A semiconductor package comprising: a base substrate; a first semiconductor chip unit attached to the base substrate and including at least one first semiconductor chip; a second semiconductor chip unit stacked on the first semiconductor chip unit and including at least one second semiconductor chip; at least one third semiconductor chip disposed between the first semiconductor chip unit and the second semiconductor chip unit and having an area smaller than that of the at least one first semiconductor chip and that of the at least one second semiconductor chip; and an insulating material layer disposed between the first semiconductor chip unit and the second semiconductor chip unit to surround at least a portion of the at least one third semiconductor chip and having a thickness larger than that of the third semiconductor chip.

15 Claims, 27 Drawing Sheets

(51) Int. Cl.
*H01L 29/40* (2006.01)
*H01L 23/48* (2006.01)
*H01L 25/065* (2006.01)
*H01L 23/00* (2006.01)
*H01L 25/00* (2006.01)
*H01L 23/31* (2006.01)

(52) U.S. Cl.
CPC .......... *H01L 24/49* (2013.01); *H01L 25/0652* (2013.01); *H01L 25/50* (2013.01); *H01L 23/3128* (2013.01); *H01L 24/16* (2013.01); *H01L 24/33* (2013.01); *H01L 24/48* (2013.01); *H01L 24/73* (2013.01); *H01L 2224/02375* (2013.01); *H01L 2224/0401* (2013.01); *H01L 2224/04042* (2013.01); *H01L 2224/05548* (2013.01); *H01L 2224/05554* (2013.01); *H01L 2224/06135* (2013.01); *H01L 2224/13025* (2013.01); *H01L 2224/16145* (2013.01); *H01L 2224/16146* (2013.01); *H01L 2224/16225* (2013.01); *H01L 2224/17181* (2013.01); *H01L 2224/2919* (2013.01); *H01L 2224/32145* (2013.01); *H01L 2224/32225* (2013.01); *H01L 2224/33181* (2013.01); *H01L 2224/48091* (2013.01); *H01L 2224/48145* (2013.01); *H01L 2224/48147* (2013.01); *H01L 2224/48227* (2013.01); *H01L 2224/49109* (2013.01); *H01L 2224/49175* (2013.01); *H01L 2224/73253* (2013.01); *H01L 2224/73265* (2013.01); *H01L 2224/83191* (2013.01); *H01L 2224/92247* (2013.01); *H01L 2225/0651* (2013.01); *H01L 2225/06506* (2013.01); *H01L 2225/06513* (2013.01); *H01L 2225/06517* (2013.01); *H01L 2225/06541* (2013.01); *H01L 2225/06562* (2013.01); *H01L 2225/06565* (2013.01); *H01L 2924/00014* (2013.01); *H01L 2924/1436* (2013.01); *H01L 2924/1437* (2013.01); *H01L 2924/15311* (2013.01); *H01L 2924/181* (2013.01)

(58) Field of Classification Search
CPC ......... H01L 23/3128; H01L 2224/2919; H01L 24/48; H01L 24/16; H01L 24/33; H01L 2224/83191; H01L 2924/00014; H01L 2224/32225; H01L 2224/0554; H01L 2924/181; H01L 2225/06517; H01L 2224/05548; H01L 2225/06565; H01L 2224/16225; H01L 2224/49175; H01L 224/04042; H01L 2224/73253; H01L 2225/06541; H01L 2224/16145; H01L 2224/02375; H01L 2224/16146; H01L 2224/13025; H01L 2224/06135; H01L 2225/0651; H01L 2224/17181; H01L 2225/06562; H01L 2224/92247; H01L 2924/15311; H01L 2224/48147; H01L 2224/48227; H01L 2224/32145; H01L 2224/33181; H01L 2225/06513; H01L 2225/06506; H01L 2924/1437; H01L 2224/48091; H01L 2924/1436; H01L 2224/48145
USPC ................ 257/737, 686, 777, 784, 786, 723
See application file for complete search history.

(56) References Cited

U.S. PATENT DOCUMENTS

| | | |
|---|---|---|
| 2007/0007639 A1 | 1/2007 | Fukazawa |
| 2007/0085184 A1 | 4/2007 | Kwon et al. |
| 2008/0150157 A1* | 6/2008 | Nishimura ............. H01L 24/13 257/777 |
| 2009/0001599 A1 | 1/2009 | Foong et al. |
| 2010/0117244 A1 | 5/2010 | Miyagawa et al. |
| 2010/0244278 A1 | 9/2010 | Shen |
| 2010/0265751 A1 | 10/2010 | Hong |
| 2011/0133324 A1 | 6/2011 | Fan et al. |
| 2011/0309496 A1 | 12/2011 | Wang et al. |
| 2012/0217657 A1 | 8/2012 | Huang et al. |
| 2013/0175706 A1* | 7/2013 | Choi .................... H01L 25/074 257/777 |

* cited by examiner

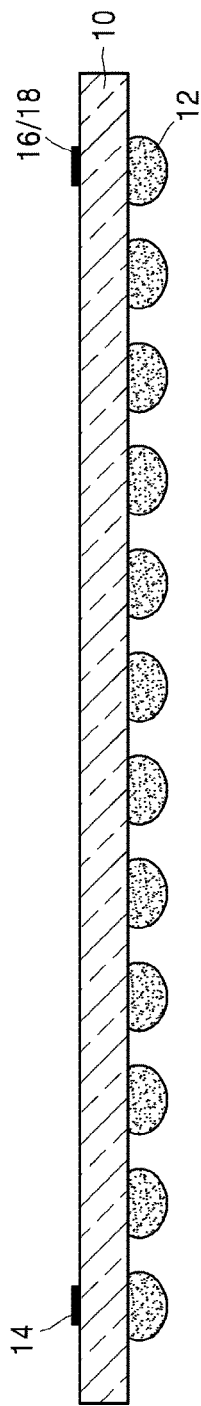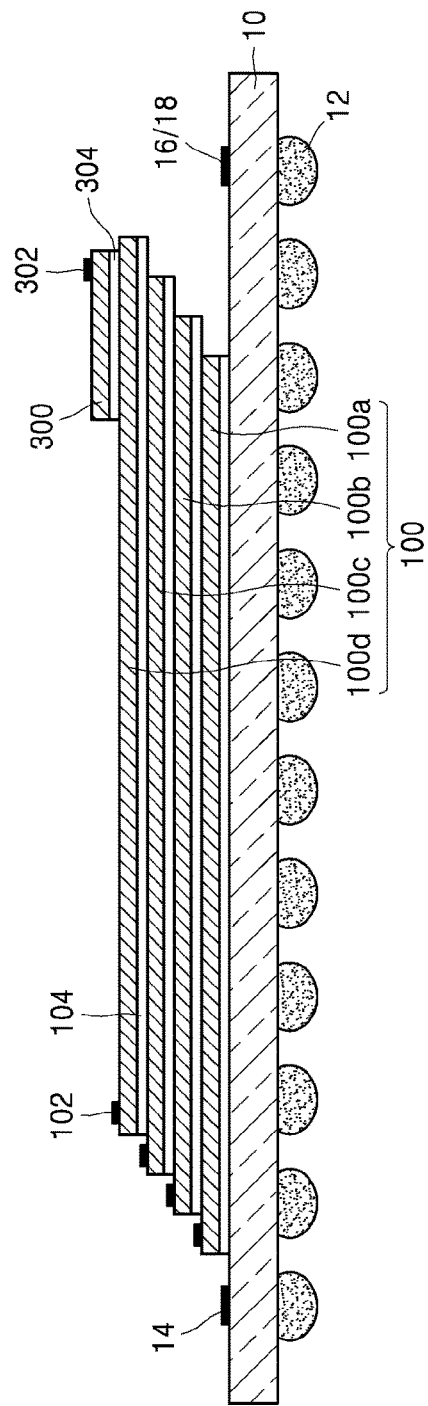

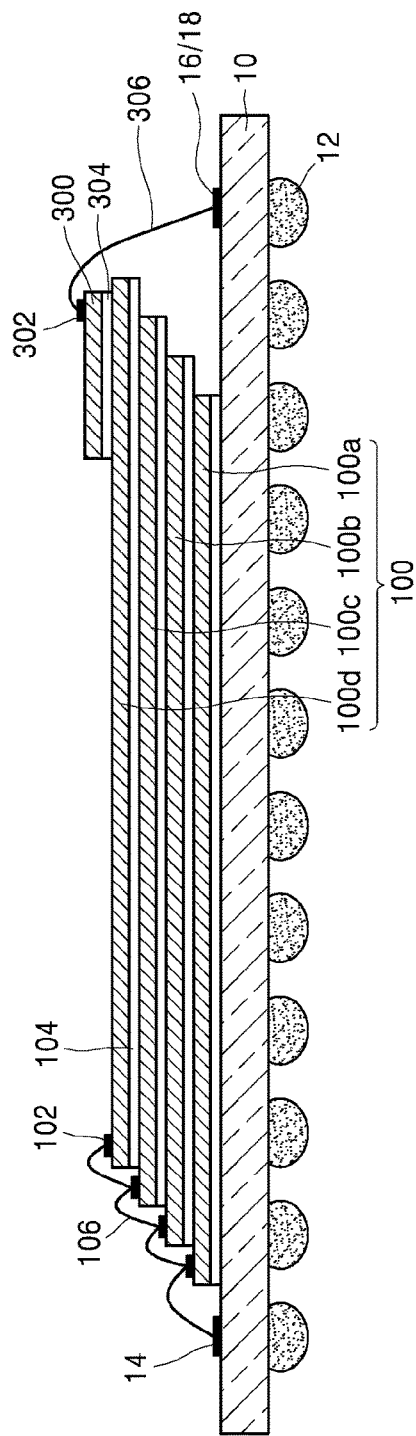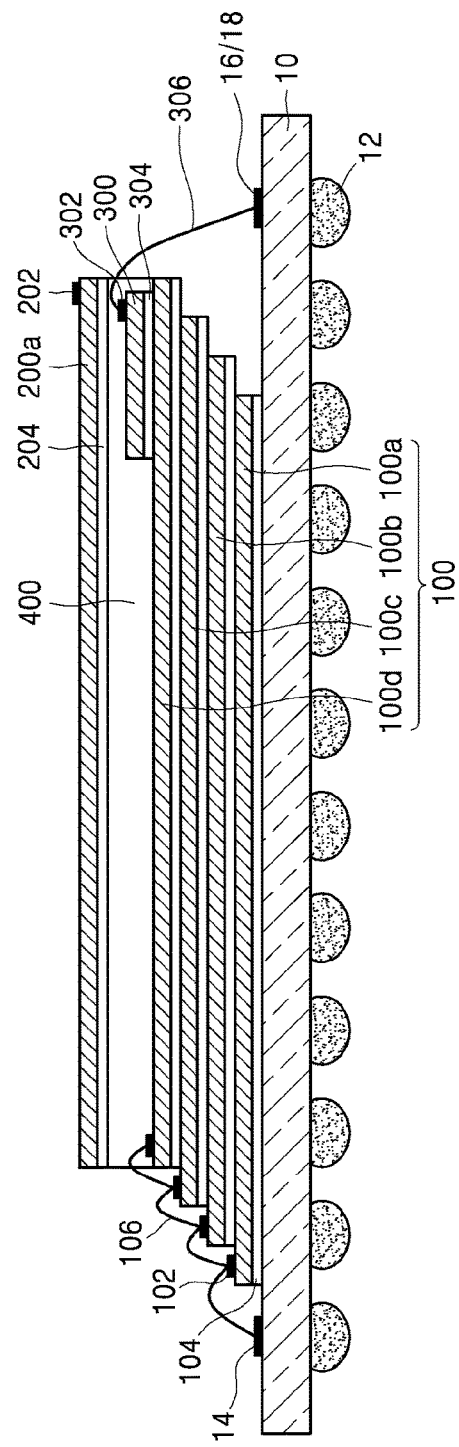

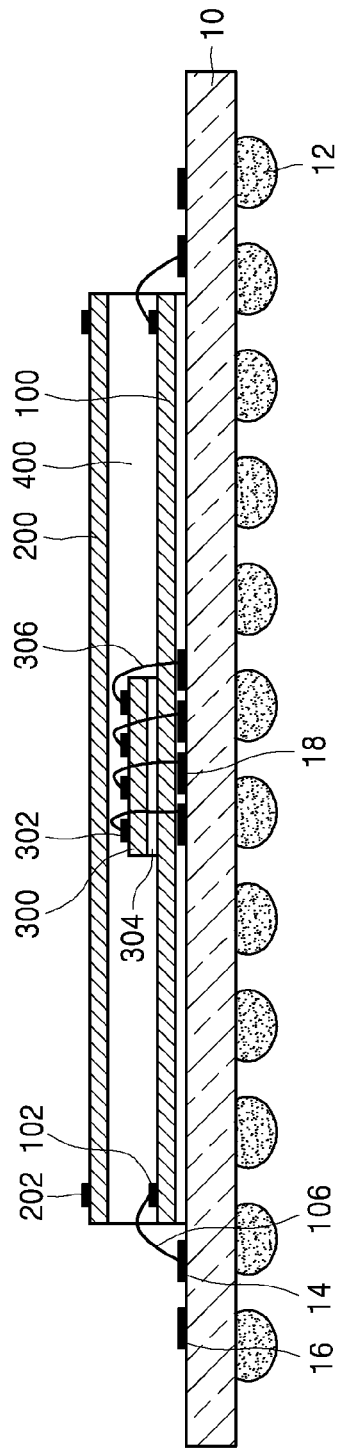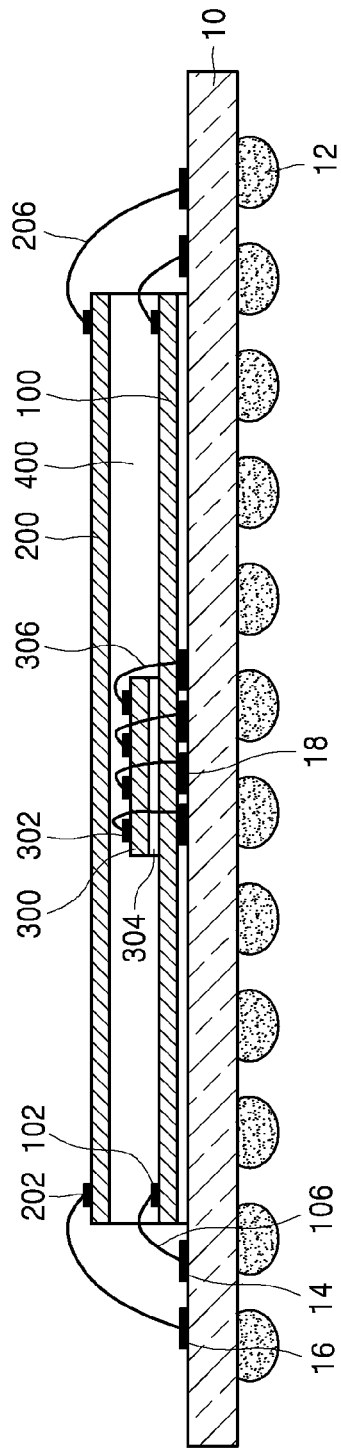

STACKED SEMICONDUCTOR PACKAGE INCLUDING A SMALLER-AREA SEMICONDUCTOR CHIP

CROSS-REFERENCE TO RELATED APPLICATIONS

This application claims the benefit of Korean Patent Application No. 10-2013-0128722, filed on Oct. 28, 2013, in the Korean Intellectual Property Office, the disclosure of which is incorporated herein in its entirety by reference.

BACKGROUND

This disclosure relates to a semiconductor package, and more particularly, to a stacked semiconductor package in which multiple semiconductor chips are stacked.

With rapid development of an electronics industry and user needs, electronic devices are more miniaturized and have higher capacity and more functions. Therefore, semiconductor packages used for the electronic devices are required to be more miniaturized and to have higher capacity and more functions. Accordingly, a semiconductor package including multiple semiconductor chips is required. However, when multiple semiconductor chips are included in one semiconductor package, a thickness and/or area of the semiconductor package is increased and thus, a volume of the semiconductor package is increased and a length of an electrical path is increased in the semiconductor package. Therefore, a characteristic of the semiconductor package is deteriorated.

SUMMARY

An embodiment includes a semiconductor package comprising: a base substrate; a first semiconductor chip unit attached to the base substrate and including at least one first semiconductor chip; a second semiconductor chip unit stacked on the first semiconductor chip unit and including at least one second semiconductor chip; at least one third semiconductor chip disposed between the first semiconductor chip unit and the second semiconductor chip unit and having an area smaller than that of the at least one first semiconductor chip and that of the at least one second semiconductor chip; and an insulating material layer disposed between the first semiconductor chip unit and the second semiconductor chip unit to surround at least a portion of the at least one third semiconductor chip and having a thickness larger than that of the third semiconductor chip.

Another embodiment includes a semiconductor package comprising: a base substrate; at least two semiconductor chips stacked on the base substrate by die adhesive films attached to respective lower surfaces; an adhesive material layer disposed between the stacked at least two semiconductor chips and having substantially the same area as that of the semiconductor chip closest to the adhesive material layer and a thickness larger than that of the respective die adhesive film; and an auxiliary semiconductor chip including at least a portion surrounded by the adhesive material layer, disposed between the at least two semiconductor chips and having an area smaller than that of the at least two semiconductor chips.

Another embodiment includes a semiconductor package, comprising: a base substrate; a plurality of first semiconductor chips stacked on the base substrate and horizontally offset from each other so that at least a portion of the upper surfaces of the first semiconductor chips are exposed; a plurality of second semiconductor chips stacked on the first semiconductor chips and horizontally offset from each other so that at least a portion of the upper surfaces of the second semiconductor chips are exposed; an insulating material layer disposed between the first semiconductor chips and the second semiconductor chips; and at least one third semiconductor chips, each third semiconductor chip having an area smaller than that of the first and second semiconductor chips and including at least a portion surrounded by the insulating material layer.

BRIEF DESCRIPTION OF THE DRAWINGS

Exemplary embodiments will be more clearly understood from the following detailed description taken in conjunction with the accompanying drawings in which:

FIGS. 21 to 26 are cross-sectional views illustrating processes of a method of manufacturing a semiconductor package according to an embodiment;

FIGS. 27 to 30 are cross-sectional views illustrating processes of a method of manufacturing a semiconductor package according to an embodiment;

DETAILED DESCRIPTION OF THE EMBODIMENTS

Figure 1:
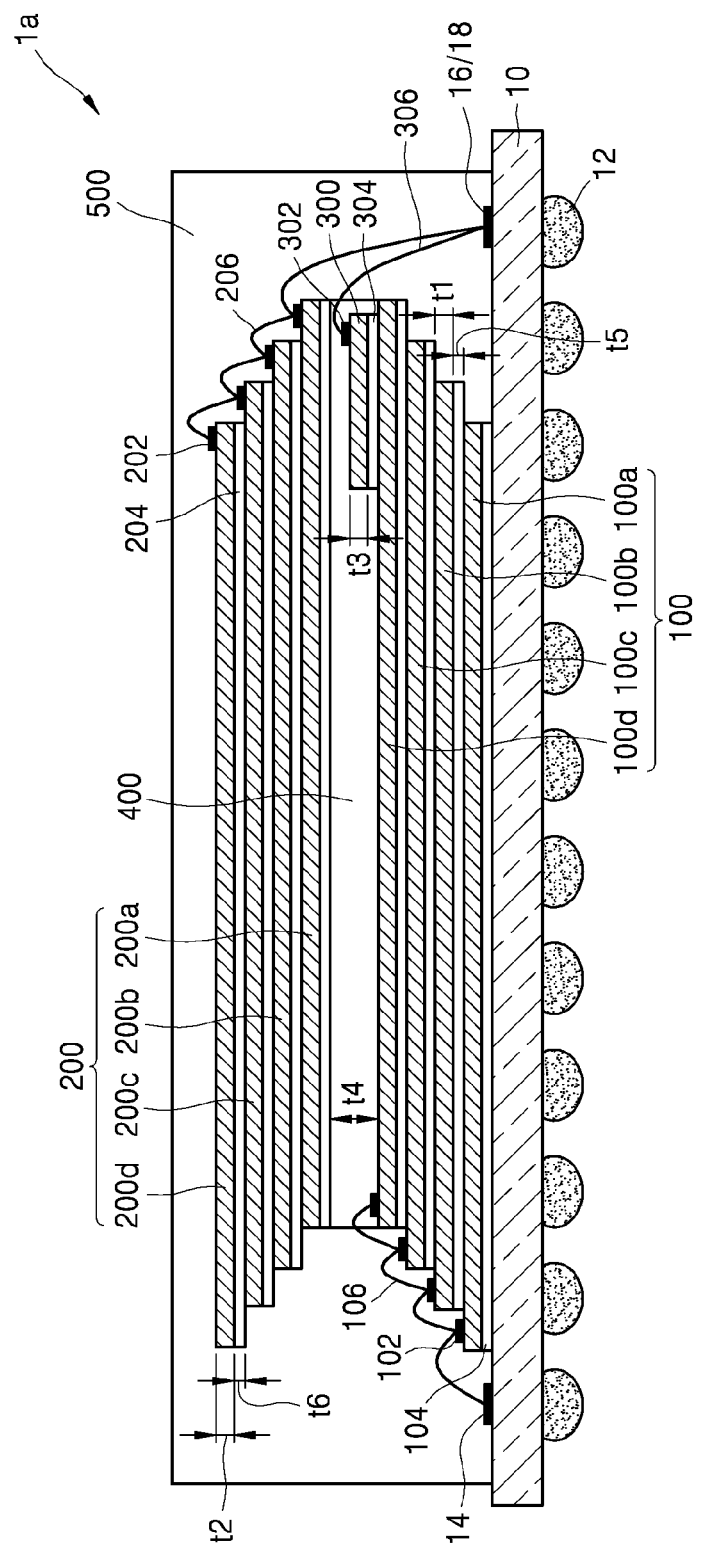
FIG. 1 is a cross-sectional view illustrating an aspect of a semiconductor package according to an embodiment.

Embodiments will now be described more fully with reference to the accompanying drawings, in which exemplary embodiments are shown. The same elements in the drawings are denoted by the same reference numerals and a repeated explanation thereof will not be given. Embodiments may, however, take many different forms and should not be construed as limited to the exemplary embodiments set forth herein. Rather, these embodiments are provided so that this disclosure will be thorough and complete, and will fully convey the scope to one of ordinary skill in the art. In the drawings, the thickness of layers and regions are exaggerated for clarity.

It will also be understood that when an element is referred to as being "on" another element, it can be directly on the other element, or intervening elements may also be present. On the other hand, when an element is referred to as being "immediately on" or as "directly contacting" another element, it can be understood that intervening elements do not exist. Other expressions describing a relationship between elements, for example, "between" and "directly between" may be interpreted similarly.

It will be understood that, although the terms first and second, etc., may be used herein to describe various elements, these elements should not be limited by these terms. These terms are only used to distinguish one element from another element. For example, a first element may be named a second element and similarly a second element may be named a first element without departing from the scope.

Unless otherwise defined, terms "include" and "have" are for representing that characteristics, numbers, steps, operations, elements, and parts described in the specification or a combination of the above exist. It may be interpreted that one or more other characteristics, numbers, steps, operations, elements, and parts or a combination of the above may be added.

Unless otherwise defined, all terms (including technical and scientific terms) used herein have the same meaning as commonly understood by one of ordinary skill in the art to which these embodiments belong.

Unless otherwise defined, an area means an area of a surface parallel to a main surface of a base substrate and a thickness means a thickness in a direction perpendicular to the main surface of the base substrate. In addition, unless otherwise defined, a vertical direction or a horizontal direction means a direction perpendicular or parallel, respectively, relative to the main surface of the base substrate. When an element is a thin plate, an area means an area of an upper surface and/or a lower surface of the plate and a thickness means a distance between the upper surface and the lower surface of the plate. In addition, unless otherwise defined, an upper surface of an element stacked on the base substrate means a surface that faces a direction opposite to the base substrate and a lower surface means a surface that faces the base substrate.

Hereinafter, embodiments will be described in detail with reference to the accompanying drawings.

FIG. 1 is a cross-sectional view illustrating an aspect of a semiconductor package according to an embodiment. Referring to FIG. 1, in a semiconductor package 1a, a first semiconductor chip unit 100 and a second semiconductor chip unit 200 are stacked on a base substrate 10. A third semiconductor chip 300 is disposed between the first semiconductor chip unit 100 and the second semiconductor chip unit 200. In the semiconductor package 1a, the first semiconductor chip unit 100, the third semiconductor chip 300, and the second semiconductor chip unit 200 may be sequentially stacked on the base substrate 10. That is, the third semiconductor chip 300 may be stacked on the first semiconductor chip unit 100 and the second semiconductor chip unit 200 may be stacked on the third semiconductor chip 300.

External connection terminals 12 may be formed on a lower surface of the base substrate 10 and connection pads 14, 16, and 18 may be formed on an upper surface of the base substrate 10. The base substrate 10 may be a printed circuit board (PCB), or any other substrate on which semiconductor chips may be mounted. The external connection terminals 12 may be, for example, solder balls. The connection pads 14, 16, and 18 may be electrically connected to the external connection terminals 12 through an inside of the base substrate 10. One or more of the connection pads 14, 16, and 18 may be connected to one or more other connection pads through the upper surface or inside of the base substrate 10. The connection pads 14, 16, and 18 may include the first connection pad 14 electrically connected to the first semiconductor chip unit 100, the second connection pad 16 electrically connected to the second semiconductor chip unit 200, and the third connection pad 18 electrically connected to the third semiconductor chip 300. The first semiconductor chip unit 100 and the first connection pad 14 may be electrically connected by a first bonding wire 106. The second semiconductor chip unit 200 and the second connection pad 16 may be electrically connected by a second bonding wire 206. The third semiconductor chip 300 and the third connection pad 18 may be electrically connected by a third bonding wire 306.

The first semiconductor chip unit 100 may include multiple first semiconductor chips 100a, 100b, 100c, and 100d. The first semiconductor chips 100a, 100b, 100c, and 100d may have substantially the same area. The first semiconductor chips 100a, 100b, 100c, and 100d may be sequentially stacked on the base substrate 10 in a direction perpendicular to the base substrate 10.

Each of the first semiconductor chips 100a, 100b, 100c, and 100d may include a first pad 102 connected to the first bonding wire 106. The first semiconductor chips 100a, 100b, 100c, and 100d may be stacked so that active surfaces thereof face in a direction opposite to the base substrate 10. The first semiconductor chips 100a, 100b, 100c, and 100d may be stacked on the base substrate 10 by first die adhesive films 104, respectively. The first semiconductor chips 100a, 100b, 100c, and 100d may be sequentially stacked on the base substrate 10 after the first die adhesive films 104 are previously attached to lower surfaces thereof.

The first semiconductor chips 100b, 100c, and 100d may be shifted in a first direction by a predetermined distance so that upper surfaces of the first semiconductor chips 100a, 100b, and 100c, respectively, are at least partially exposed.

The first direction may be horizontal to a main surface of the base substrate 10. The first semiconductor chips 100b, 100c, and 100d may be shifted in the first direction so that portions of the upper surfaces of the first semiconductor chips 100a, 100b, and 100c, respectively, in which the first pads 102 are formed are exposed. The first bonding wire 106 may be connected to the first connection pad 14 of the base substrate 10 after sequentially connecting the first pads 102 and the uppermost first semiconductor chip 100d to the lowermost first semiconductor chip 100a. However, embodiments are not limited to the above and the first bonding wire 106 may separately connect the first pads 102 of the first semiconductor chips 100a, 100b, 100c, and 100d to the first connection pad 14 of the base substrate 10.

The third semiconductor chip 300 may be stacked on the uppermost first semiconductor chip 100d so that an active surface thereof faces in a direction opposite to the base substrate 10. The third semiconductor chip 300 may have a smaller area than those of the first semiconductor chips 100a, 100b, 100c, and 100d. In particular, the third semiconductor chip 300 may have a smaller area than that of the uppermost first semiconductor chip 100d. The third semiconductor chip 300 may be attached onto the uppermost first semiconductor chip 100d so as to overlap the entire uppermost first semiconductor chip 100d.

The third semiconductor chip 300 may include a third pad 302 connected to a third bonding wire 306. The third semiconductor chip 300 may be attached onto the uppermost first semiconductor chip 100d by a third die adhesive film 304. The third bonding wire 306 may connect the third pad 302 to the third connection pad 18 of the base substrate 10.

The second semiconductor chip unit 200 may be stacked on the first semiconductor chip unit 100 and the third semiconductor chip 300. The second semiconductor chip unit 200 may include multiple second semiconductor chips 200a, 200b, 200c, and 200d. The second semiconductor chips 200a, 200b, 200c, and 200d may have substantially the same area. Each of the second semiconductor chips 200a, 200b, 200c, and 200d may have a larger area than that of the third semiconductor chip 300.

Each of the second semiconductor chips 200a, 200b, 200c, and 200d may include a second pad 202 connected to the second bonding wire 206. The second semiconductor chips 200a, 200b, 200c, and 200d may be sequentially stacked on the third semiconductor chip 300 in a vertical direction. The second semiconductor chips 200a, 200b, 200c, and 200d may be stacked so that active surfaces thereof face a direction opposite to the base substrate 10. The second semiconductor chips 200a, 200b, 200c, and 200d may be stacked on the third semiconductor chip 300 by respective second die adhesive films 204. The second semiconductor chips 200a, 200b, 200c, and 200d may be sequentially stacked on the third semiconductor chip 300 after the associated second die adhesive films 204 are previously attached to lower surfaces thereof.

An insulating material layer 400 may be disposed at a lower end of the second semiconductor chip unit 200, that is, on the lower surface of the lowermost second semiconductor chip 200a. The insulating material layer 400 may surround at least a portion of the third semiconductor chip 300. A thickness t4 of the insulating material layer 400 may be larger than a thickness t3 of the third semiconductor chip 300. The thickness t4 of the insulating material layer 400 may be larger than a thickness t5 of each of the first die adhesive films 104 or a thickness t6 of each of the second die adhesive films 204.

The insulating material layer 400 may cover both upper and side surfaces of the third semiconductor chip 300. In addition, the insulating material layer 400 may entirely or at least partially cover a portion to which the third semiconductor chip 300 is not attached in the upper surface of the uppermost first semiconductor chip 100d.

Since the third semiconductor chip 300 is surrounded by the insulating material layer 400, the thickness t3 of the third semiconductor chip 300 may be smaller than a thickness t1 of each of the first semiconductor chips 100a, 100b, 100c, and 100d or a thickness t2 of each of the second semiconductor chips 200a, 200b, 200c, and 200d.

The insulating material layer 400 may be formed of a material capable of sustaining the second semiconductor chip unit 200 stacked thereon while being surrounded by the third semiconductor chip 300. The insulating material layer 400 may be formed of, for example, epoxy resin, acryl resin, synthetic rubber, polyimide, or a combination of epoxy resin, acryl resin, synthetic rubber, polyimide, an adhesive layer, or the like.

After the third semiconductor chip 300 is attached onto the uppermost first semiconductor chip 100d and the first and third bonding wires 106 and 306 are formed, the insulating material layer 400 may be coated on the uppermost first semiconductor chip 100d and the third semiconductor chip 300. Alternatively, after the insulating material layer 400 is attached to the lower surface of the lowermost second semiconductor chip 200a, the lowermost second semiconductor chip 200a is attached onto the uppermost first semiconductor chip 100d and the third semiconductor chip 300 so that the insulating material layer 400 may be formed.

It is illustrated that both the second die adhesive films 204 and the insulating material layer 400 are attached to the lower surface of the lowermost second semiconductor chip 200a of the second semiconductor chip unit 200. However, in other embodiments, when, after the insulating material layer 400 is previously attached to the lower surface of the lowermost second semiconductor chip 200a, the lowermost second semiconductor chip 200a is stacked on the uppermost first semiconductor chip 100d and the third semiconductor chip 300, the second die adhesive film 204 may be omitted on the lower surface of the lowermost second semiconductor chip 200a. In this case, the insulating material layer 400 may function as a die adhesive film for the lowermost second semiconductor chip 200a. The insulating material layer 400 may have substantially the same area as that of the lowermost second semiconductor chip 200a, that is, the second semiconductor chip 200a adjacent to the insulating material layer 400 on the insulating material layer 400. Edges of the insulating material layer 400 and the lowermost second semiconductor chip 200a may coincide with each other in the direction vertical to the base substrate 10.

The second semiconductor chips 200a, 200b, 200c, and 200d may be shifted in a second direction different from the first direction by a predetermined distance so that the upper surfaces thereof are at least partially exposed, respectively. The second direction may be horizontal to the main surface of the base substrate 10. The first direction and the second direction may be opposite to each other. The second semiconductor chips 200a, 200b, 200c, and 200d may be shifted in the second direction to be stacked so that portions of the upper surfaces, in which the second pads 202 are formed, are exposed, respectively. The second bonding wire 206 may be connected to the second connection pad 16 of the base substrate 10 after sequentially connecting the second pads 202 and the uppermost second semiconductor chip 200d to the lowermost second semiconductor chip 200a. However, embodiments are not limited to the above and the second bonding wire 206 may separately connect the second pads 202 of the second semiconductor chips 200a, 200b, 200c, and 200d to the second connection pad 16 of the base substrate 10.

The first semiconductor chips 100a, 100b, 100c, and 100d and the second semiconductor chips 200a, 200b, 200c, and 200d may be the same kind of semiconductor chips having substantially the same area. Edges of the first and second semiconductor chips 100d and 200a adjacent to lower and upper surfaces of the insulating material layer 400, that is, the uppermost first semiconductor chip 100d and the lowermost second semiconductor chip 200a may coincide with each other in the direction vertical to the base substrate 10. Edges of the uppermost first semiconductor chip 100d, the insulating material layer 400, and the lowermost second semiconductor chip 200a may coincide with each other in the direction vertical to the base substrate 10 so that the insulating material layer 400 may fill a space between the uppermost first semiconductor chip 100d and the lowermost second semiconductor chip 200a. Therefore, an area of the semiconductor package 1a may be minimized. In this case, since the thickness t4 of the insulating material layer 400 is relatively thick, a shape of a portion of the first bonding wire 106 for connecting the first pad 102 to the uppermost first semiconductor chip 100d may be maintained.

The first semiconductor chips 100a, 100b, 100c, and 100d and the second semiconductor chips 200a, 200b, 200c, and 200d may be, for example, memory semiconductor chips. The first semiconductor chips 100a, 100b, 100c, and 100d and the second semiconductor chips 200a, 200b, 200c, and 200d may be, for example, flash memories. The third semiconductor chip 300 may provide a controller, a buffer, a cache memory, a power semiconductor device, or the like required for using the first semiconductor chips 100a, 100b, 100c, and 100d and the second semiconductor chips 200a, 200b, 200c, and 200d. The third semiconductor chip 300 may be, for example, a controller chip, a dynamic random access memory (DRAM), a static random access memory (SRAM), an intelligent power device (IPD), or the like. The third semiconductor chip 300 may be used with an auxiliary semiconductor chip.

A mold layer 500 that surrounds the first semiconductor chip unit 100, the second semiconductor chip unit 200, and the third semiconductor chip 300 may be formed on the base substrate 10. The mold layer 500 may surround all of the first semiconductor chip unit 100, the second semiconductor chip unit 200, the third semiconductor chip 300, the first connection pad 14, the second connection pad 16, and the third connection pad 18 of the base substrate 10, and the first bonding wire 106, the second bonding wire 206, and the third bonding wire 306. The mold layer 500 may be formed of, for example, epoxy molding compound (EMC).

The third semiconductor chip 300 may be disposed between the first semiconductor chip unit 100 and the second semiconductor chip unit 200 so that a length of an electrical path to the base substrate 10 may be reduced in comparison with a case in which the third semiconductor chip 300 is stacked on the uppermost end of the stacked semiconductor chips and a loop of the third bonding wire 306 for connecting the third semiconductor chip 300 and the base substrate 10 may be reduced. Therefore, a height of the semiconductor package 1a may be reduced. Moreover, a length of the bonding wire 306 may be smaller.

In addition, in comparison with a semiconductor package in which the third semiconductor chip 300 is attached immediately on the base substrate 10, since the number of semiconductor chips stacked on the third semiconductor chip 300 is reduced and the semiconductor chips are sustained by the insulating material layer 400, although the second semiconductor chips 200a, 200b, 200c, and 200d are thinned, the stacked second semiconductor chips 200a, 200b, 200c, and 200d may be maintained without being curved. Therefore, the total height of the semiconductor package 1a may be reduced.

Figure 2:
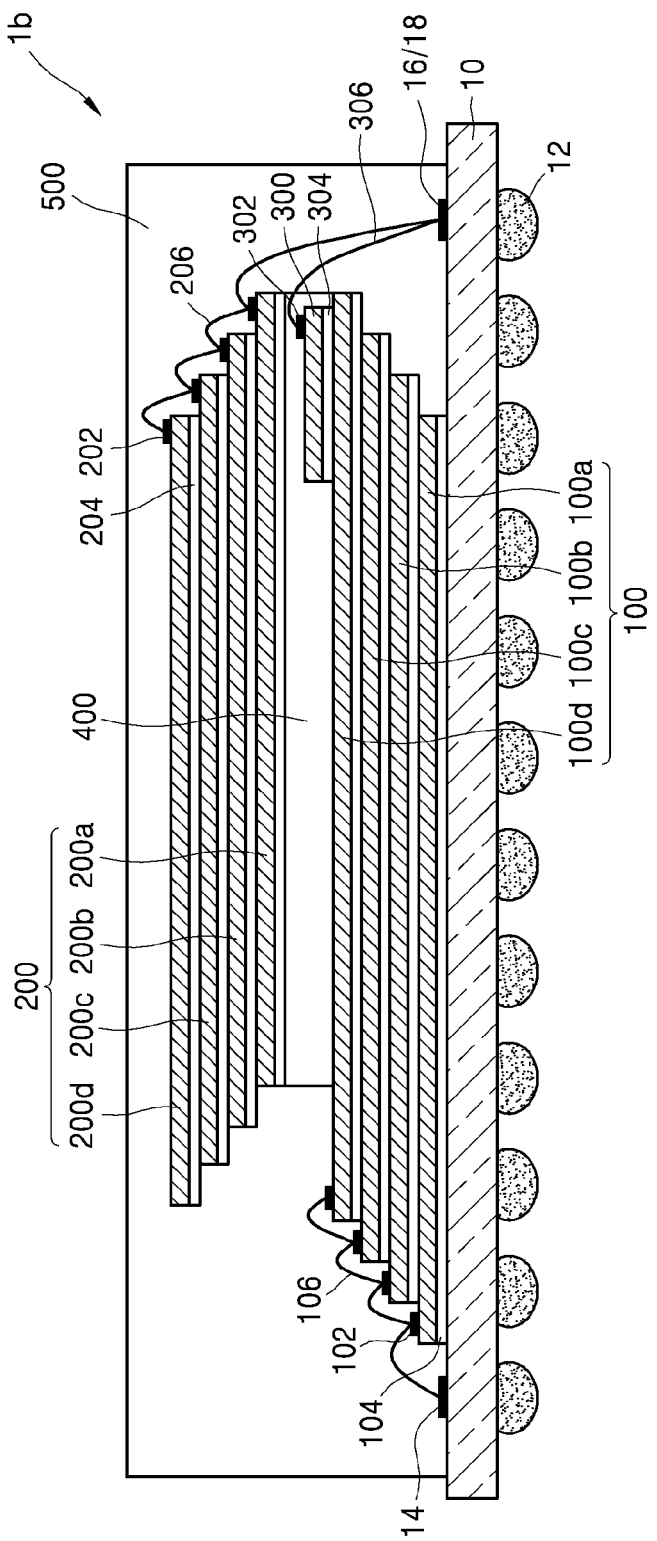
FIG. 2 is a cross-sectional view illustrating an aspect of a semiconductor package according to an embodiment.

FIG. 2 is a cross-sectional view illustrating an aspect of a semiconductor package according to an embodiment. In description of the semiconductor package 1b illustrated in FIG. 2, description of similar content as that of the semiconductor package 1a illustrated in FIG. 1 may be omitted. Referring to FIG. 2, in the semiconductor package 1b, a first semiconductor chip unit 100, a third semiconductor chip 300, and a second semiconductor chip unit 200 are sequentially stacked on a base substrate 10 in a vertical direction. An insulating material layer 400 may be disposed between the first semiconductor chip unit 100 and the second semiconductor chip unit 200 and may be formed to surround the third semiconductor chip 300. The insulating material layer 400 may cover both upper and side surfaces of the third semiconductor chip 300. The third semiconductor chip 300 may have a smaller area than that of each of first semiconductor chips 100a, 100b, 100c, and 100d and second semiconductor chips 200a, 200b, 200c, and 200d.

Unlike the second semiconductor chips 200a, 200b, 200c, and 200d of the semiconductor package 1a of FIG. 1, the second semiconductor chips 200a, 200b, 200c, and 200d of the semiconductor package 1b of FIG. 2 may have smaller areas than those of the first semiconductor chips 100a, 100b, 100c, and 100d. Edges of the insulating material layer 400 and the second semiconductor chip 200a adjacent to the insulating material layer 400 on the insulating material layer 400 may coincide with each other in the direction vertical to the base substrate 10. Therefore, in the semiconductor package 1a of FIG. 1, the insulating material layer 400 covers a whole upper surface of the uppermost first semiconductor chip 100d. However, in the semiconductor package 1b of FIG. 2, the insulating material layer 400 may expose a portion of the upper surface of the uppermost first semiconductor chip 100d, for example, a portion of the upper surface of the uppermost first semiconductor chip 100d in which a first pad 102 is formed.

On side surfaces of edges of the first semiconductor chip 100d and the second semiconductor chip 200a adjacent to lower and upper surfaces of the insulating material layer 400, that is, the uppermost first semiconductor chip 100d and the lowermost semiconductor chip 200a may coincide with each other in the direction vertical to the base substrate 10.

Figure 3:
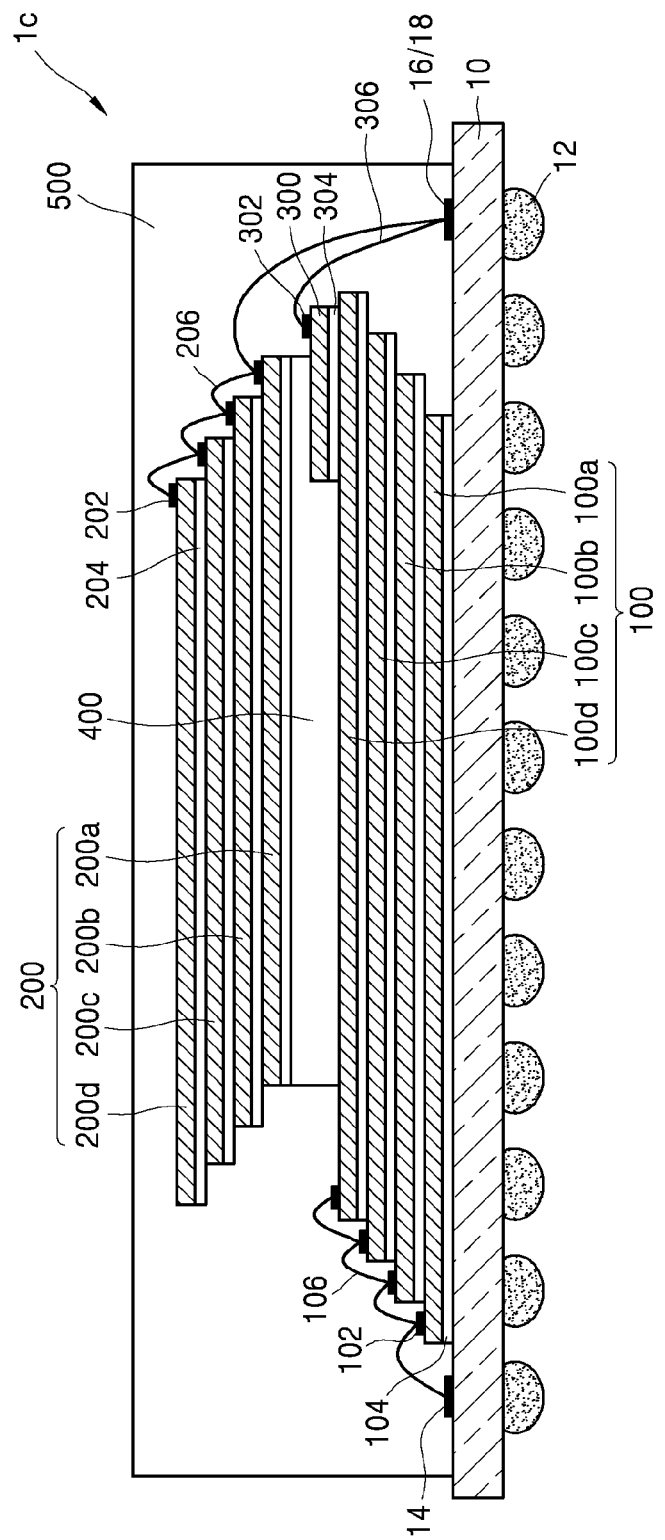
FIG. 3 is a cross-sectional view illustrating an aspect of a semiconductor package according to an embodiment.

FIG. 3 is a cross-sectional view illustrating an aspect of a semiconductor package according to an embodiment. In description of the semiconductor package 1c illustrated in FIG. 3, description of similar content as those of the semiconductor packages 1a and 1b illustrated in FIGS. 1 and 2 may be omitted. Referring to FIG. 3, in the semiconductor package 1c, a first semiconductor chip unit 100, a third semiconductor chip 300, and a second semiconductor chip unit 200 are sequentially stacked on a base substrate 10 in a vertical direction. The third semiconductor chip 300 may have a smaller area than that of each of first semiconductor chips 100a, 100b, 100c, and 100d and second semiconductor chips 200a, 200b, 200c, and 200d. The second semiconductor chips 200a, 200b, 200c, and 200d may have smaller areas than those of the first semiconductor chips 100a, 100b, 100c, and 100d. An insulating material layer 400 may be disposed between the first semiconductor chip unit 100 and the second semiconductor chip unit 200 and may be formed to surround a portion of the third semiconductor chip 300.

One side surface of the third semiconductor chip 300 may protrude from the insulating material layer 400 to be exposed. That is, the third semiconductor chip 300 may protrude from one side surfaces of the insulating material layer 400 and the second semiconductor chip unit 200a adjacent to the insulating material layer 400 on the insulating material layer 400 so that one side surface thereof is exposed. Therefore, a portion of an upper surface of the third semiconductor chip 300, for example, a portion of an upper surface of the third semiconductor chip 300 in which the third pad 302 is formed may be exposed. In addition, the second semiconductor chip unit 200 may be shifted in the direction horizontal to the upper surface of the base substrate relative to the third semiconductor chip 300 and relative to the first semiconductor chip unit 100. Accordingly, side surfaces of the first semiconductor chip 100d, the second semiconductor chip 200a, and the third semiconductor chip 300 may not be aligned.

Figure 4:
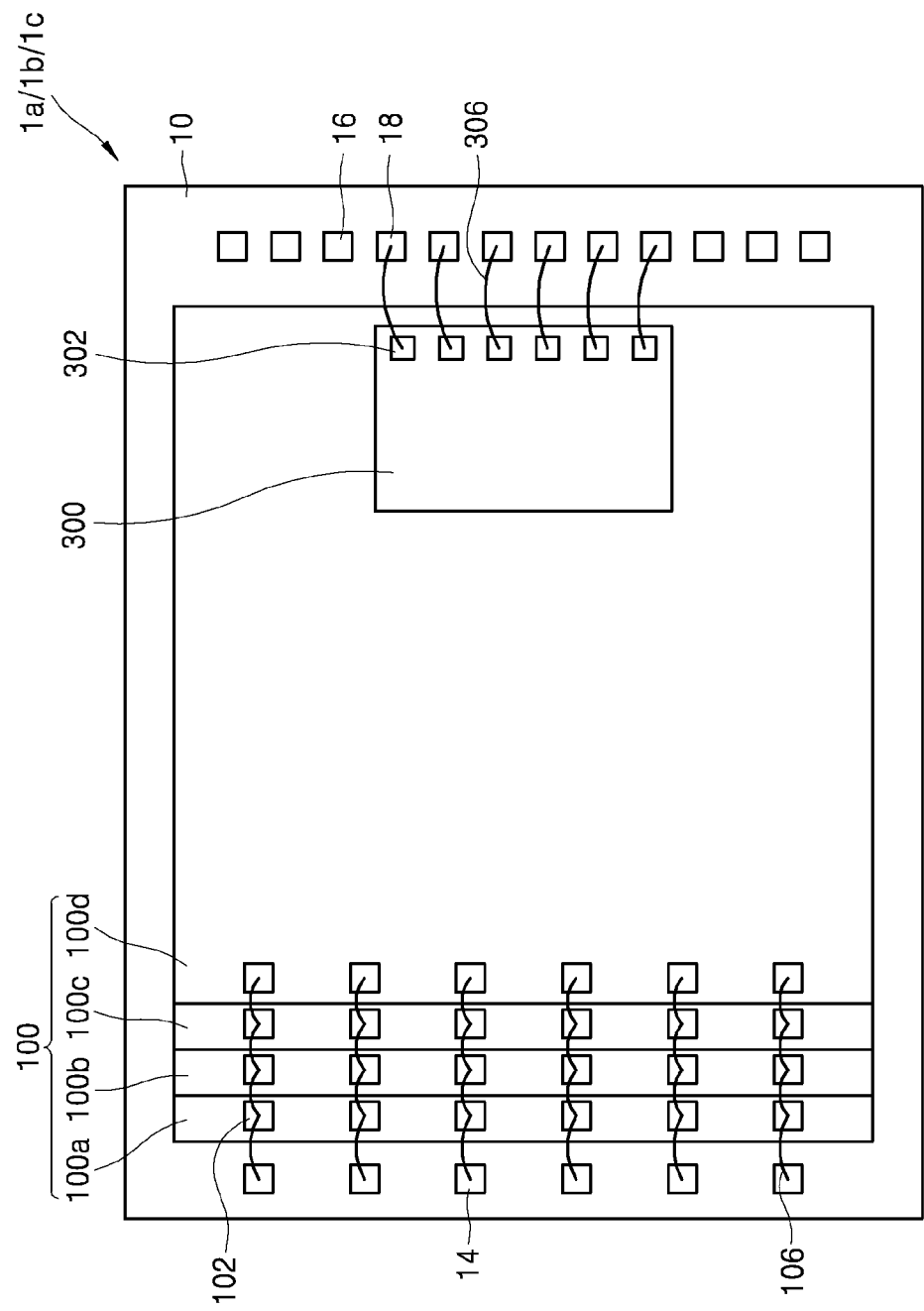
FIG. 4 is a plan view illustrating a process before a second semiconductor chip unit is stacked on the semiconductor packages according to the embodiments of FIGS. 1 to 3.

FIG. 4 is a plan view illustrating a process before a second semiconductor chip unit is stacked on the aspects of the semiconductor packages according to the embodiments of FIGS. 1 to 3. Referring to FIG. 4, in the semiconductor packages 1a, 1b, and 1c, the semiconductor chips 100a, 100b, 100c, and 100d are stacked on the base substrate 10. The first semiconductor chips 100a, 100b, 100c, and 100d may be shifted in the first direction by a predetermined distance to be stacked so that the upper surfaces thereof may be at least partially exposed, respectively. The first semiconductor chips 100a, 100b, 100c, and 100d may be shifted in the first direction so that portions of the upper surfaces in which the first pads 102 are formed may be exposed.

In FIG. 4, it is illustrated that the first semiconductor chips 100a, 100b, 100c, and 100d are shifted so that portions of upper surfaces are exposed. However, the first semiconductor chips 100a, 100b, 100c, and 100d may be shifted by a predetermined distance to be stacked so that portions of upper surfaces adjacent to two adjacent sides may be exposed. That is, the first direction may be a diagonal direction that connects edges of the lowermost first semiconductor chip 100a as well as a direction parallel to one side of the lowermost first semiconductor chip 100a. In this case, the first pads 102 may be formed on the upper surfaces of the first semiconductor chips 100a, 100b, 100c, and 100d adjacent to the two adjacent sides.

The first bonding wire 106 may sequentially connect the first pads 102 of the first semiconductor chips 100a, 100b, 100c, and 100d to be connected to the first connection pad 14. The third pad 302 of the third semiconductor chip 300 may be connected to the third connection pad 18 through the third bonding wire 306.

In FIG. 4, it is illustrated that the second connection pad 16 and the third connection pad 18 are separately formed. However, other embodiments are not limited to the above and the second connection pad 16 and the third connection pad 18 may be one common connection pad. In this case, the second bonding wire 206 and the third bonding wire 306 illustrated in FIGS. 1 to 3 may each be connected to the common connection pad.

Figure 5:
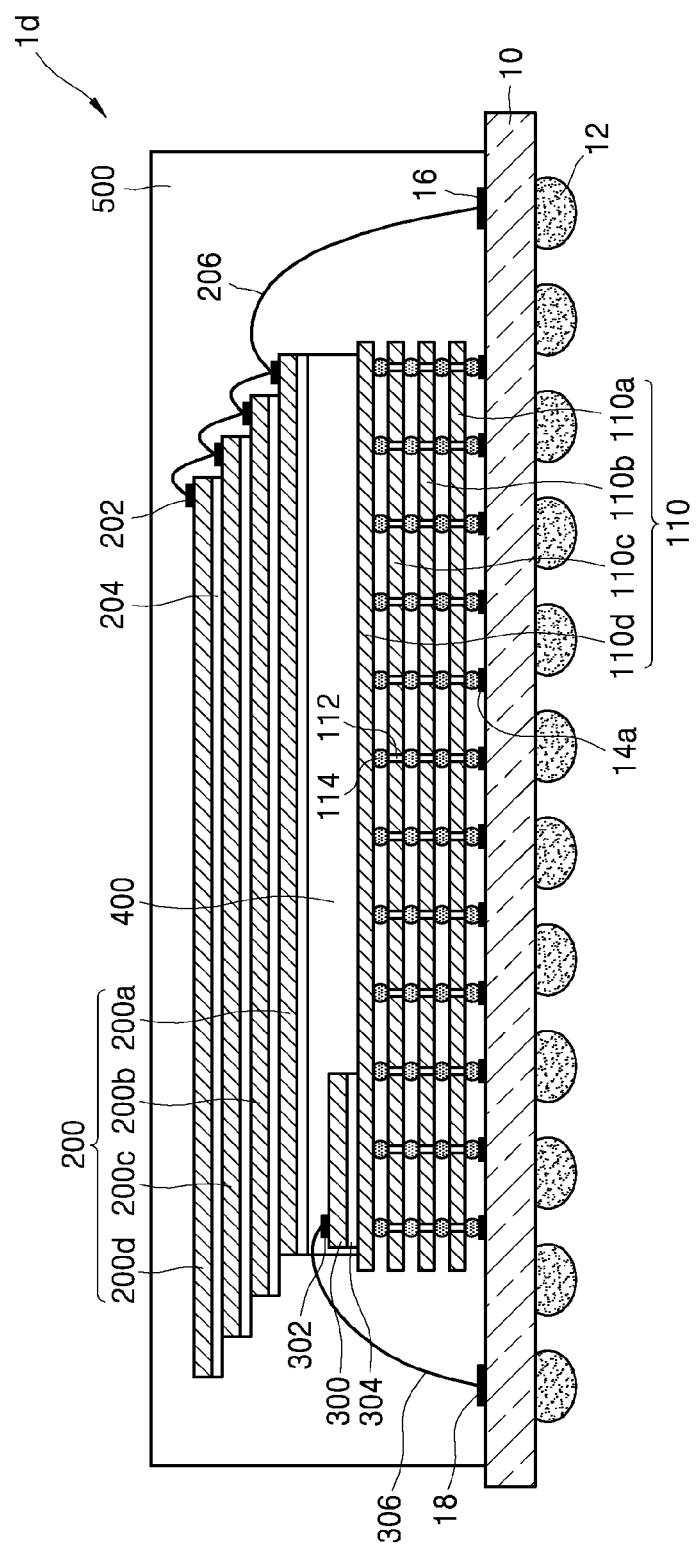
FIG. 5 is a cross-sectional view illustrating a semiconductor package according to an embodiment.
Figure 6:
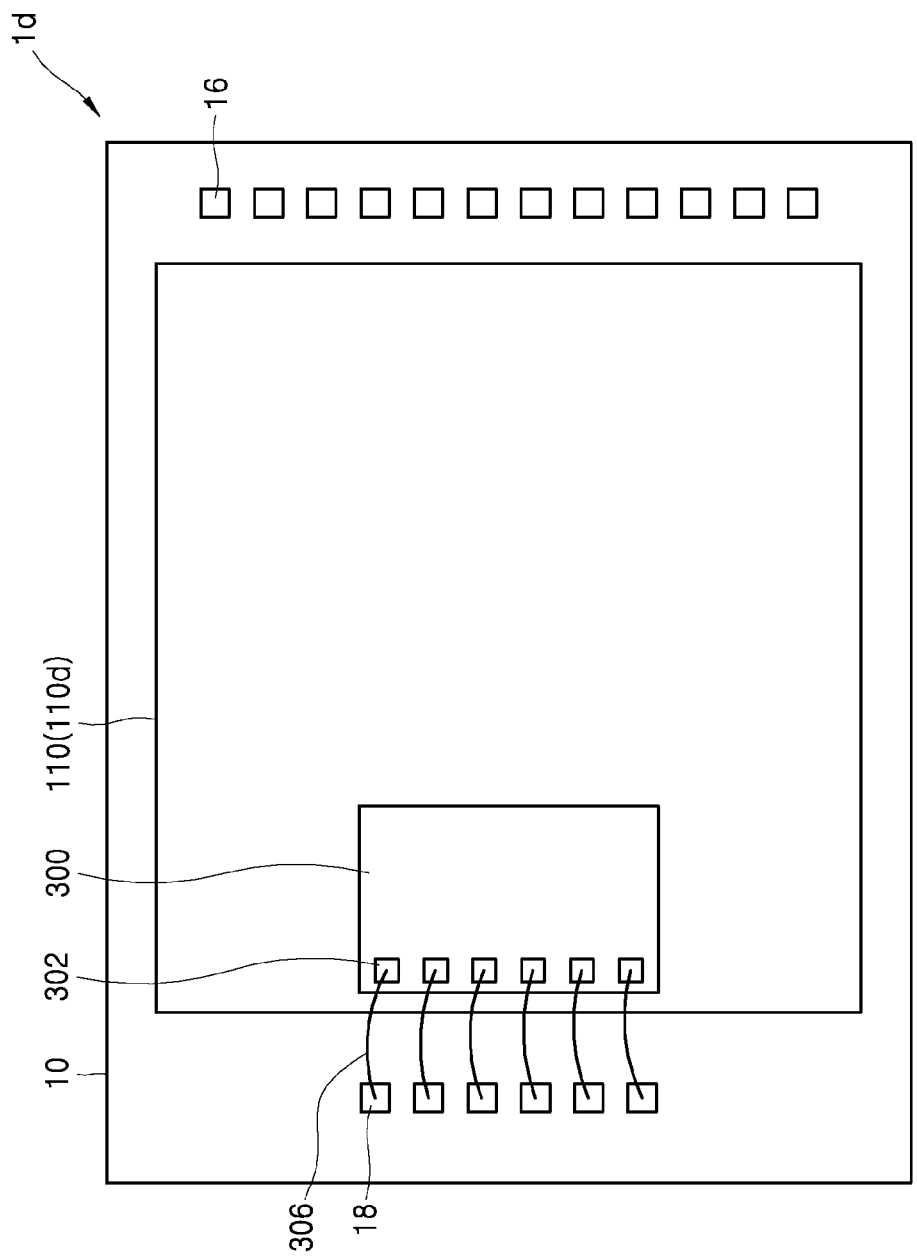
FIG. 6 is a plan view illustrating a process before a second semiconductor chip unit is stacked on the semiconductor package according to the embodiment of FIG. 5.

FIG. 5 is a cross-sectional view illustrating an aspect of a semiconductor package according to an embodiment. FIG. 6 is a plan view illustrating a process before a second semiconductor chip unit is stacked on the semiconductor package according to the embodiment of FIG. 5. In description of the semiconductor package 1d illustrated in FIGS. 5 and 6, description of content similar to that of the semiconductor package 1a illustrated in FIGS. 1 and 4 may be omitted.

Referring to FIGS. 5 and 6, in the semiconductor package 1d, a first semiconductor chip unit 110, a third semiconductor chip 300, and a second semiconductor chip unit 200 are sequentially stacked on a base substrate 10 in a vertical direction. An insulating material layer 400 may be disposed between the first semiconductor chip unit 110 and the second semiconductor chip unit 200 and may be formed to surround the third semiconductor chip 300. The first semiconductor chip unit 110 and the second semiconductor chip unit 200 may include multiple first semiconductor chips 110a, 110b, 110c, and 110d and multiple second semiconductor chips 200a, 200b, 200c, and 200d, respectively.

The first semiconductor chips 110a, 110b, 110c, and 110d may be sequentially stacked on the base substrate 10 in the vertical direction. Through electrodes 112 are formed in the first semiconductor chips 110a, 110b, 110c, and 110d, and the first semiconductor chips 110a, 110b, 110c, and 110d may be electrically connected to first connection pads 14a of the base substrate 10 by the through electrodes 112 and bumps 114 for connecting the through electrodes 112. The first semiconductor chips 110a, 110b, 110c, and 110d may be stacked so that active surfaces face the base substrate 10 and the through electrodes 112 may not be formed in the uppermost first semiconductor chip 110d. In the semiconductor package 1d, since a bonding wire for connecting the first semiconductor chips 110a, 110b, 110c, and 110d and the base substrate 10 is not used, the first connection pads 14a may be arranged under the first semiconductor chip unit 110 on the base substrate 10.

A second connection pad 16 for the second semiconductor chip unit 200 and a third connection pad 18 for the third semiconductor chip 300 may be arranged on opposite sides based on the first semiconductor chip unit 110. However, in other embodiments, the second connection pad 16 and the third connection pad 18 may be disposed in other locations.

The second semiconductor chips 200a, 200b, 200c, and 200d may be connected to the second connection pad 16 by a second bonding wire 206. The third semiconductor chip 300 may be connected to the third connection pad 18 by a third bonding wire 306.

Figure 7:
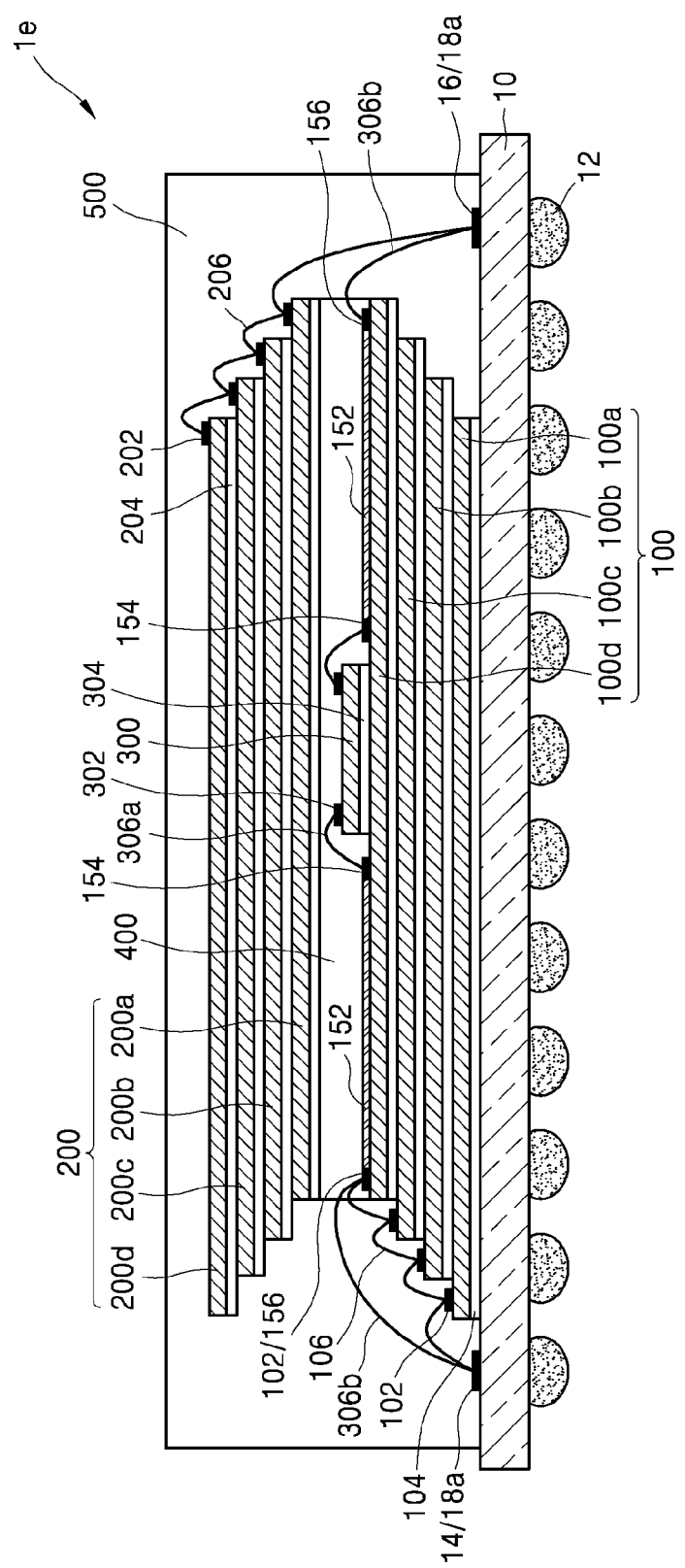
FIG. 7 is a cross-sectional view illustrating an aspect of a semiconductor package according to an embodiment.
Figure 8:
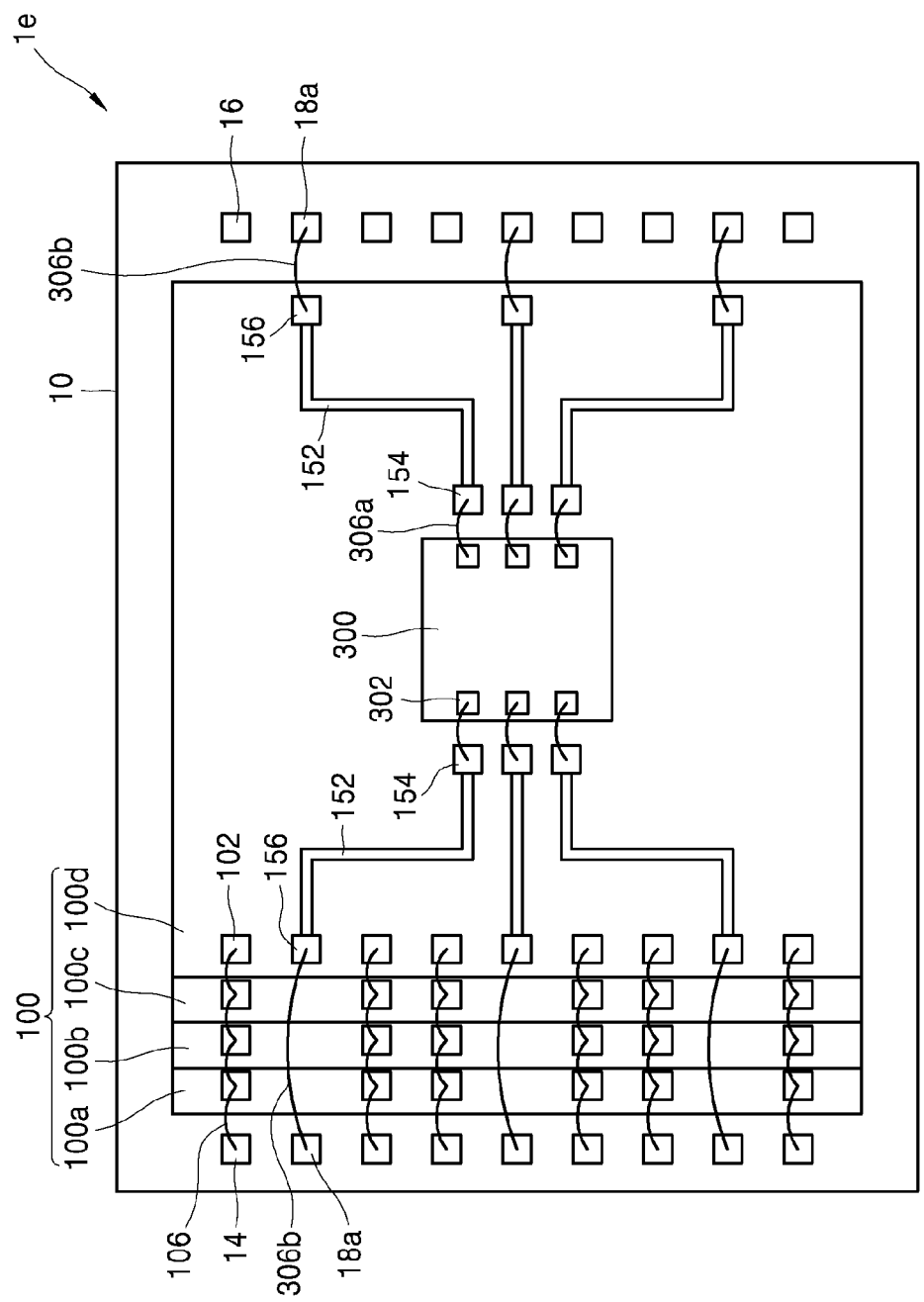
FIG. 8 is a plan view illustrating a process before a second semiconductor chip unit is stacked on the semiconductor package according to the embodiment of FIG. 7.

FIG. 7 is a cross-sectional view illustrating an aspect of a semiconductor package according to an embodiment. FIG. 8 is a plan view illustrating a process before a second semiconductor chip unit is stacked on the semiconductor package according to the embodiment of FIG. 7. In description of a semiconductor package 1e illustrated in FIGS. 7 and 8, description of content similar to that of the semiconductor package 1a illustrated in FIGS. 1 and 4 may be omitted.

Referring to FIGS. 7 and 8, in the semiconductor package 1e, a first semiconductor chip unit 100, a third semiconductor chip 300, and a second semiconductor chip unit 200 are sequentially stacked on a base substrate 10 in a vertical direction. An insulating material layer 400 may be disposed between the first semiconductor chip unit 100 and the second semiconductor chip unit 200 and may be formed to surround the third semiconductor chip 300. The third semiconductor chip 300 may be attached to an inner portion of an upper surface of the uppermost first semiconductor chip 100d. In this embodiment, the third semiconductor chip 300 is attached to a center portion of the upper surface of the uppermost first semiconductor chip 100d.

The third semiconductor chip 300 may include third pads 302. Rewiring line patterns 152 may be formed on the upper surface of the uppermost first semiconductor chip 100d. At both ends of the rewiring line patterns 152, first rewiring line pads 154 and second rewiring line pads 156 may be formed, respectively. It is illustrated that the rewiring line patterns 152 are exposed on the upper surface of the uppermost first semiconductor chip 100d. However, only the first rewiring line pads 154 and the second rewiring line pads 156 at the both ends of the rewiring line patterns 152 may be exposed and a protective layer (not shown) for covering the rewiring line patterns 152 may be further formed.

The third pads 302 may be connected to the first rewiring line pads 154 by third auxiliary bonding wires 306a. The second rewiring line pads 156 may be connected to third connection pads 18a by third bonding wires 306b. That is, the third semiconductor chip 300 may be sequentially connected to the base substrate 10 through the third pads 302, the third auxiliary bonding wires 306a, the first rewiring line pads 154, the rewiring line patterns 152, the second rewiring line pads 156, the third bonding wires 306b, and the third connection pads 18a. By the rewiring line patterns 152, positions of the third connection pads 18a connected to the third semiconductor chip 300 may be freely designed. For example, the third connection pads 18a may be dispersed to various places across an upper surface of the base substrate 10.

The rewiring line patterns 152 may be conductive lines for connecting the third semiconductor chip 300, which are formed in addition to rewiring lines for arranging first pads 102 in the first semiconductor chips 100a, 100b, 100c, and 100d, in particular, in the uppermost first semiconductor chip 100d. That is, the rewiring line may be formed on the upper surface of the uppermost first semiconductor chip 100d and a passivation layer is formed on the rewiring line to expose the first pad 102. Then, the rewiring line patterns 152 for connecting the third semiconductor chip 300 may be additionally formed on the passivation layer. Alternatively, the rewiring line patterns 152 may be formed with the rewiring lines and the first rewiring line pads 154 and the second rewiring line pads 156 may be formed with the first pads 102.

The rewiring line patterns 152 may be formed in the semiconductor packages 1b, 1c, and 1d illustrated in FIGS. 2, 3, and 5 so that arrangement of the third semiconductor chip 300 and/or arrangement of the third connection pad 18 may be changed.

Figure 9:
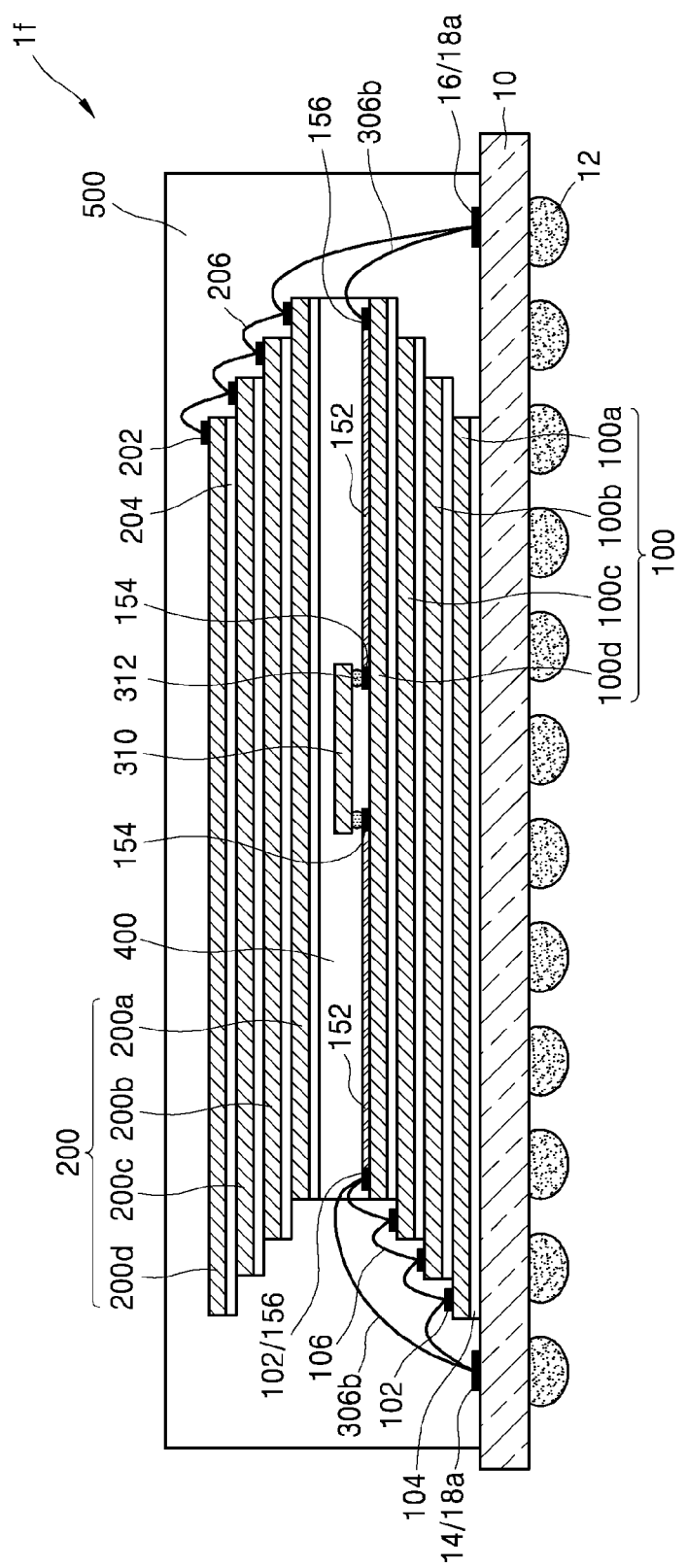
FIG. 9 is a cross-sectional view illustrating an aspect of a semiconductor package according to an embodiment.
Figure 10:
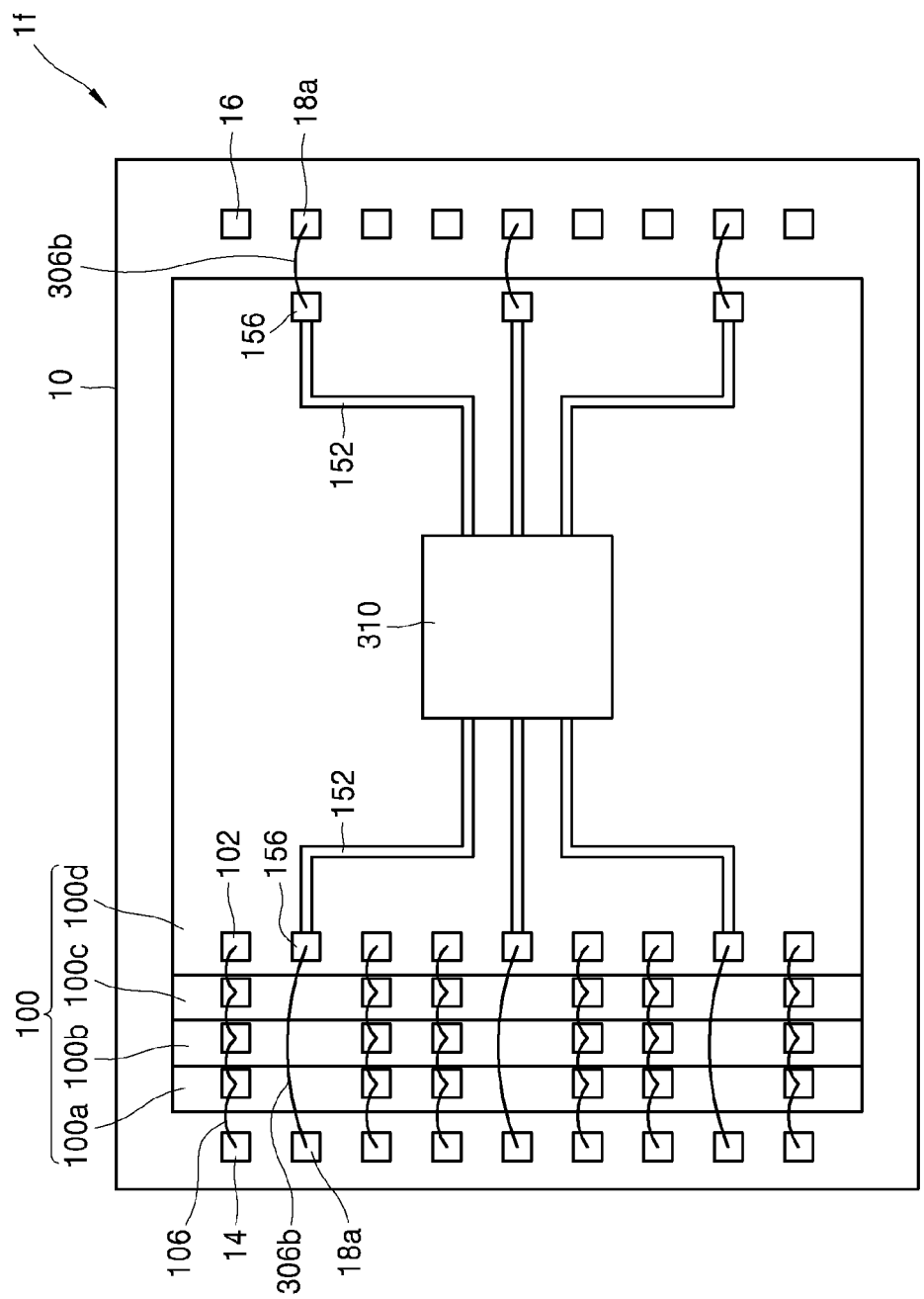
FIG. 10 is a plan view illustrating a process before a second semiconductor chip unit is stacked on the semiconductor package according to the embodiment of FIG. 9.

FIG. 9 is a cross-sectional view illustrating an aspect of a semiconductor package according to an embodiment. FIG. 10 is a plan view illustrating a process before a second semiconductor chip unit is stacked on the semiconductor package according to the embodiment of FIG. 9. In description of a semiconductor package 1f illustrated in FIGS. 9 and 10, description of content similar to that of the semiconductor package 1e illustrated in FIGS. 7 and 8 may be omitted.

Referring to FIGS. 9 and 10, a third semiconductor chip 310 may be attached on a first semiconductor chip unit 100 by a flip-chip method so that an active surface of the third semiconductor chip 310 faces the first semiconductor chip unit 100. The third semiconductor chip 310 may be connected to first rewiring line pads 154 of rewiring line patterns 152 by bumps 312.

By combining the semiconductor package 1f illustrated in FIGS. 9 and 10 and the semiconductor packages 1a, 1b, 1c, 1d, and 1e illustrated in FIGS. 1 to 8, a semiconductor package having both the third semiconductor chip 310 connected by using the flip-chip method and the third semiconductor chip 300 connected by using a wire bonding method may be formed.

Figure 11:
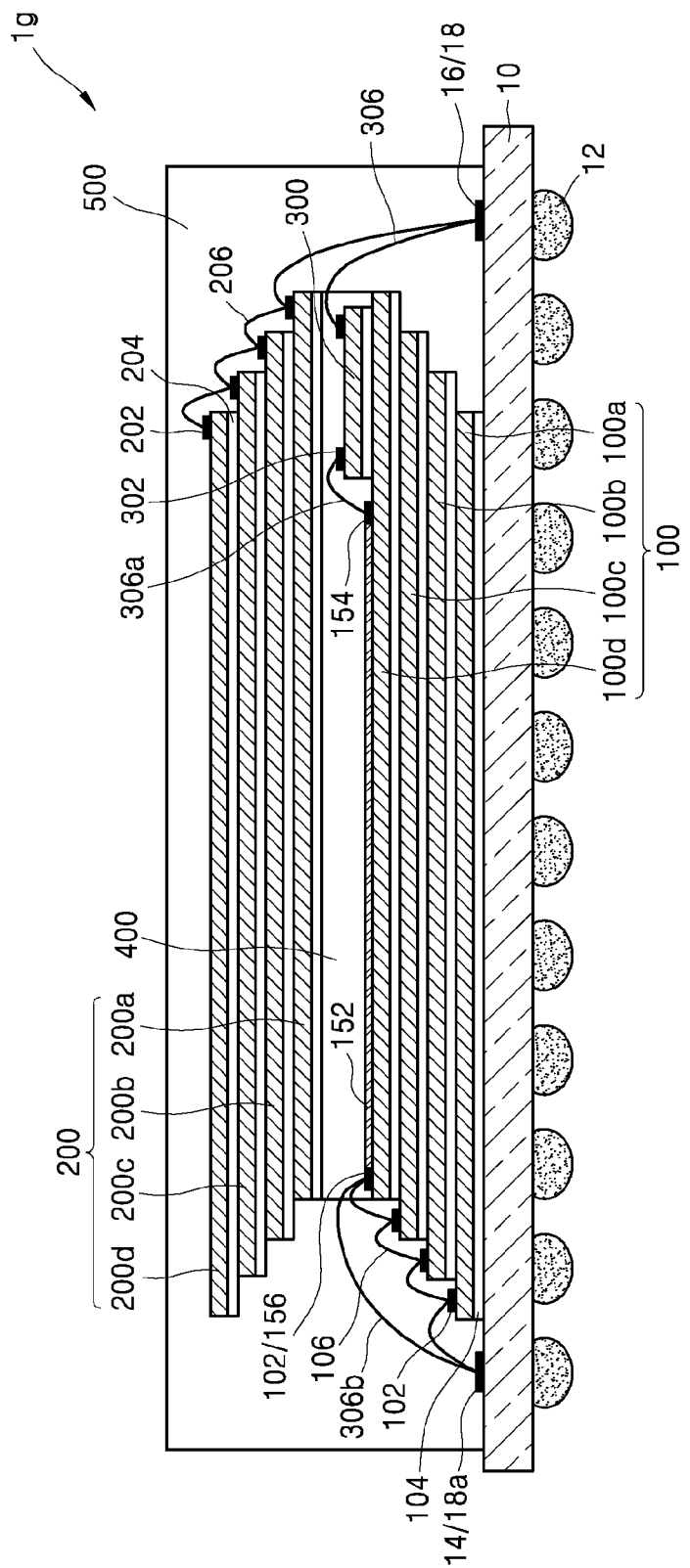
FIG. 11 is a cross-sectional view illustrating an aspect of a semiconductor package according to an embodiment.
Figure 12:
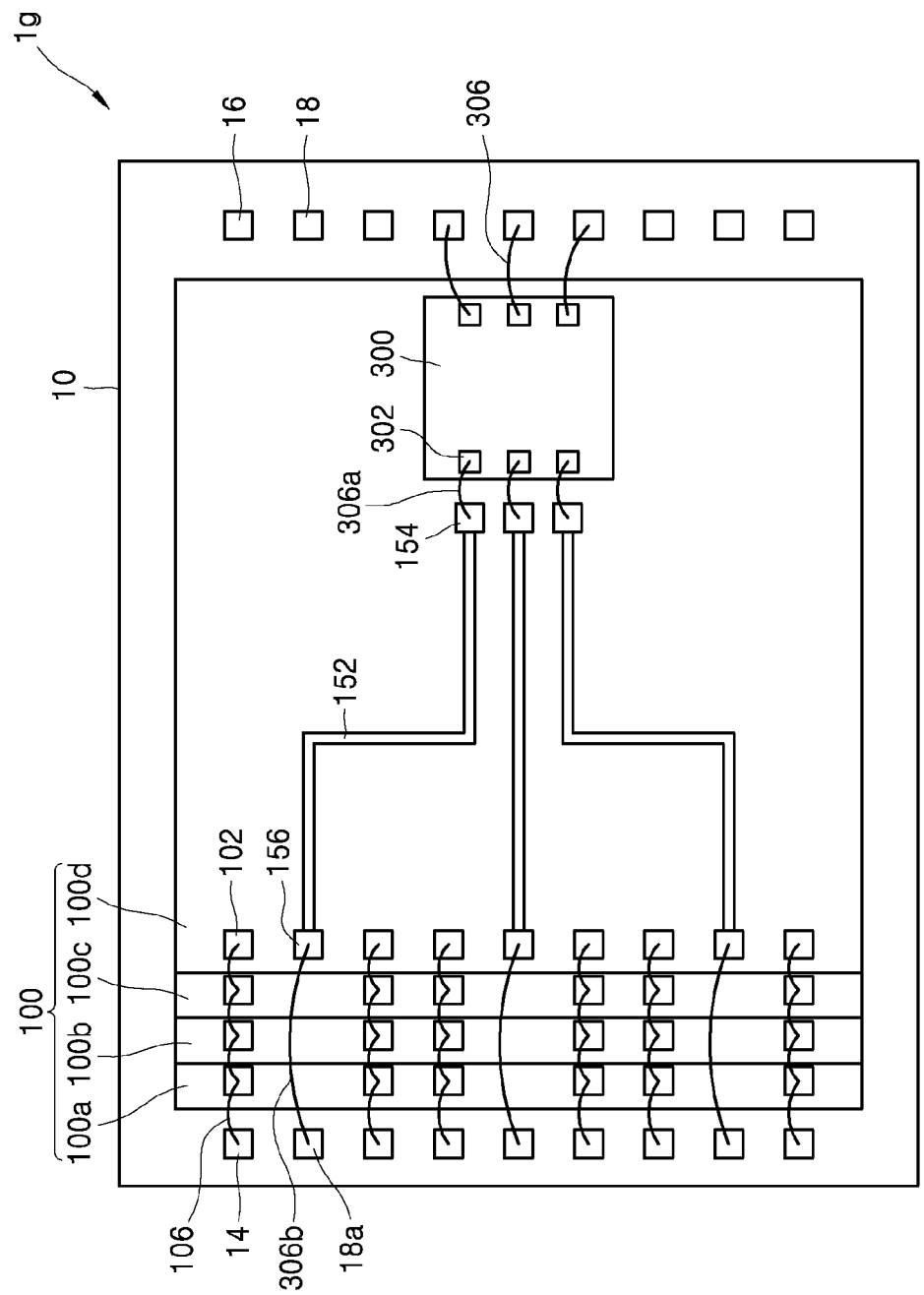
FIG. 12 is a plan view illustrating a process before a second semiconductor chip unit is stacked on the semiconductor package according to the embodiment of FIG. 11.

FIG. 11 is a cross-sectional view illustrating an aspect of a semiconductor package according to an embodiment. FIG. 12 is a plan view illustrating a process before a second semiconductor chip unit is stacked on the semiconductor package according to the embodiment of FIG. 11.

Referring to FIGS. 11 and 12, in a semiconductor package 1g, one of third pads 302 of a third semiconductor chip 300 is directly connected to a third connection pad 18 of a base substrate 10 by a bonding wire 306 and the other of the third pads 302 may be connected to a third connection pad 18a by using bonding wires 306a and 306b and a rewiring line pattern 152. In consideration of a length of an electrical path through which the third semiconductor chip 300 and the first semiconductor chips 100a, 100b, 100c, and 100d are electrically connected and a length of an electrical path through which the third semiconductor chip 300 and second semiconductor chips 200a, 200b, 200c, and 200d are electrically connected, a method of connecting the third semiconductor chip 300 and the base substrate 10 may be selectively used. Therefore, signal transmission time between the third semiconductor chip 300 and the first semiconductor chips 100a, 100b, 100c, and 100d and signal transmission time between the third semiconductor chip 300 and the second semiconductor chips 200a, 200b, 200c, and 200d may be designed to be similar or different as occasion demands.

Figure 13:
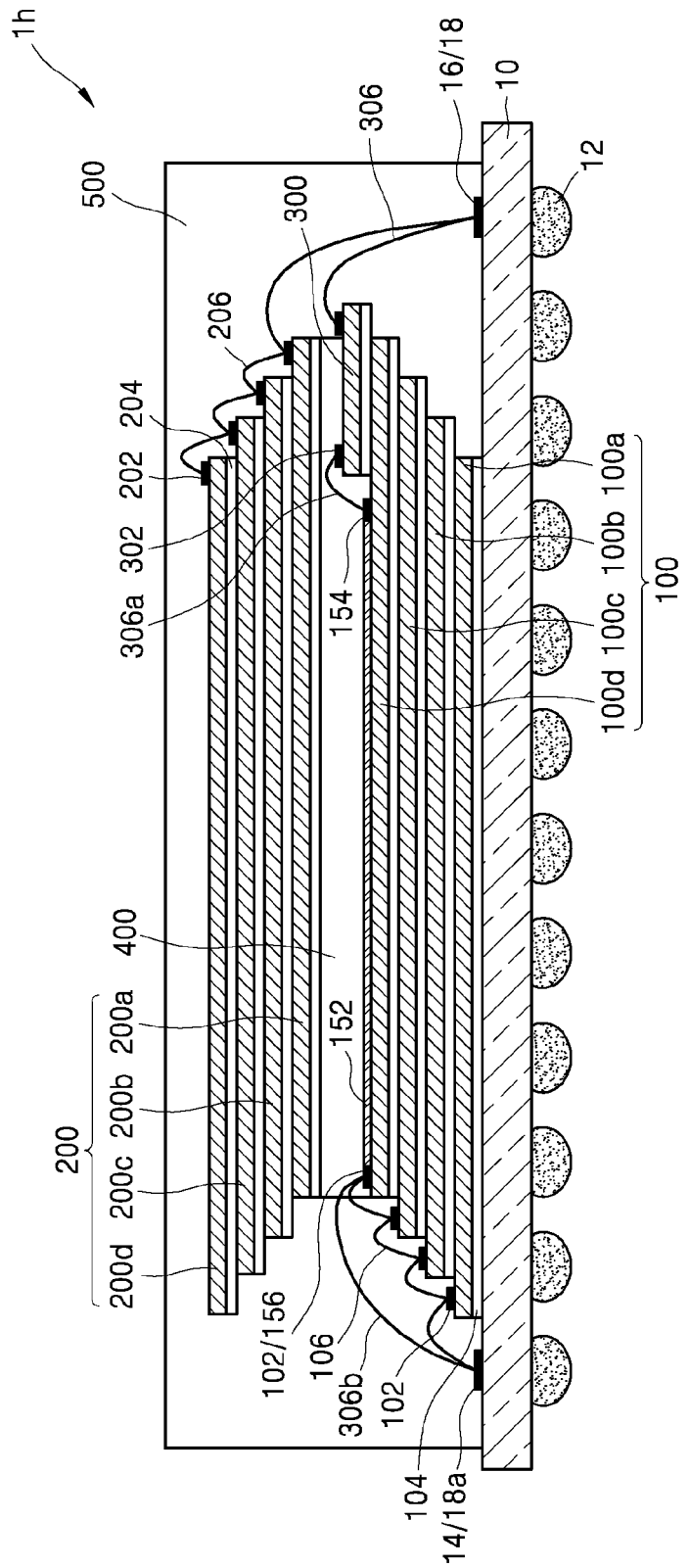
FIG. 13 is a cross-sectional view illustrating an aspect of a semiconductor package according to an embodiment.
Figure 14:
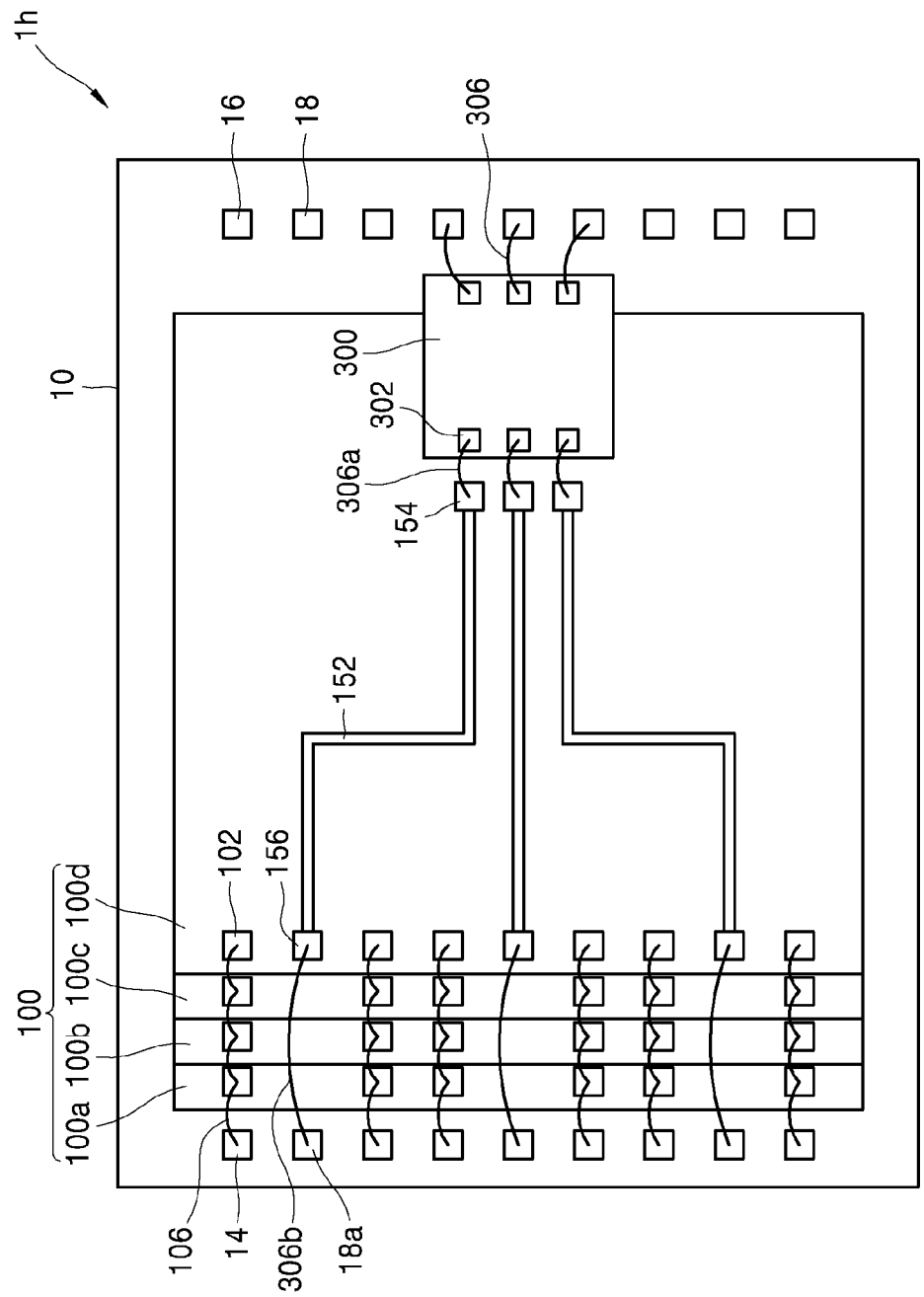
FIG. 14 is a plan view illustrating a process before a second semiconductor chip unit is stacked on the semiconductor package according to the embodiment of FIG. 13.

FIG. 13 is a cross-sectional view illustrating an aspect of a semiconductor package according to an embodiment. FIG. 14 is a plan view illustrating a process before a second semiconductor chip unit is stacked on the semiconductor package according to the embodiment of FIG. 13. In description of a semiconductor package 1h illustrated in FIGS. 13 and 14, description of content similar to that of the semiconductor package 1g illustrated in FIGS. 11 and 12 may be omitted.

Referring to FIGS. 13 and 14, at least one side surface of a third semiconductor chip 300 may protrude from an insulating material layer 400 to be exposed. For example, the third semiconductor chip 300 may protrude from one side surfaces of the insulating material layer 400 and a second semiconductor chip 200a adjacent to the insulating material layer 400 on the insulating material layer 400 so that one side surface thereof is exposed. Therefore, a portion of an upper surface of the third semiconductor chip 300, for example, a portion in which a third pad 302 is formed may be exposed. One side surface of the third semiconductor chip 300 may protrude beyond one side surface of a first semiconductor chip 100d adjacent to the third semiconductor chip 300 under the third semiconductor chip 300. Therefore, a loop of a third bonding wire 306 for connecting the third pad 302 of the third semiconductor chip 300 and the third connection pad 18 may be more easily formed.

As occasion demands, a rewiring line pattern 152 may be omitted. In this case, the third semiconductor chip 300 may be connected to a base substrate 10 through the third bonding wire 306 for connecting the third pad 302 that protrudes to be exposed and the third connection pad 18.

Figure 15:
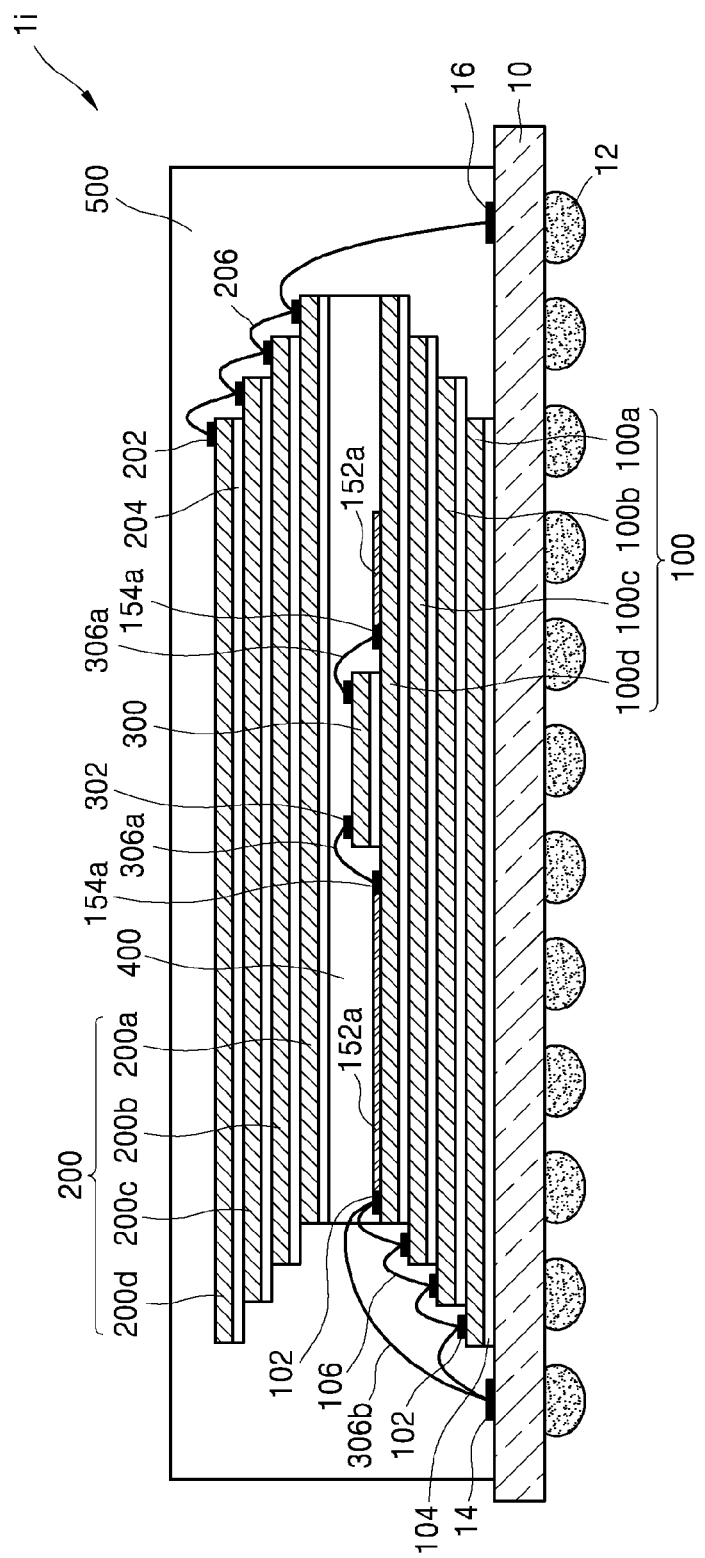
FIG. 15 is a cross-sectional view illustrating an aspect of a semiconductor package according to an embodiment.
Figure 16:
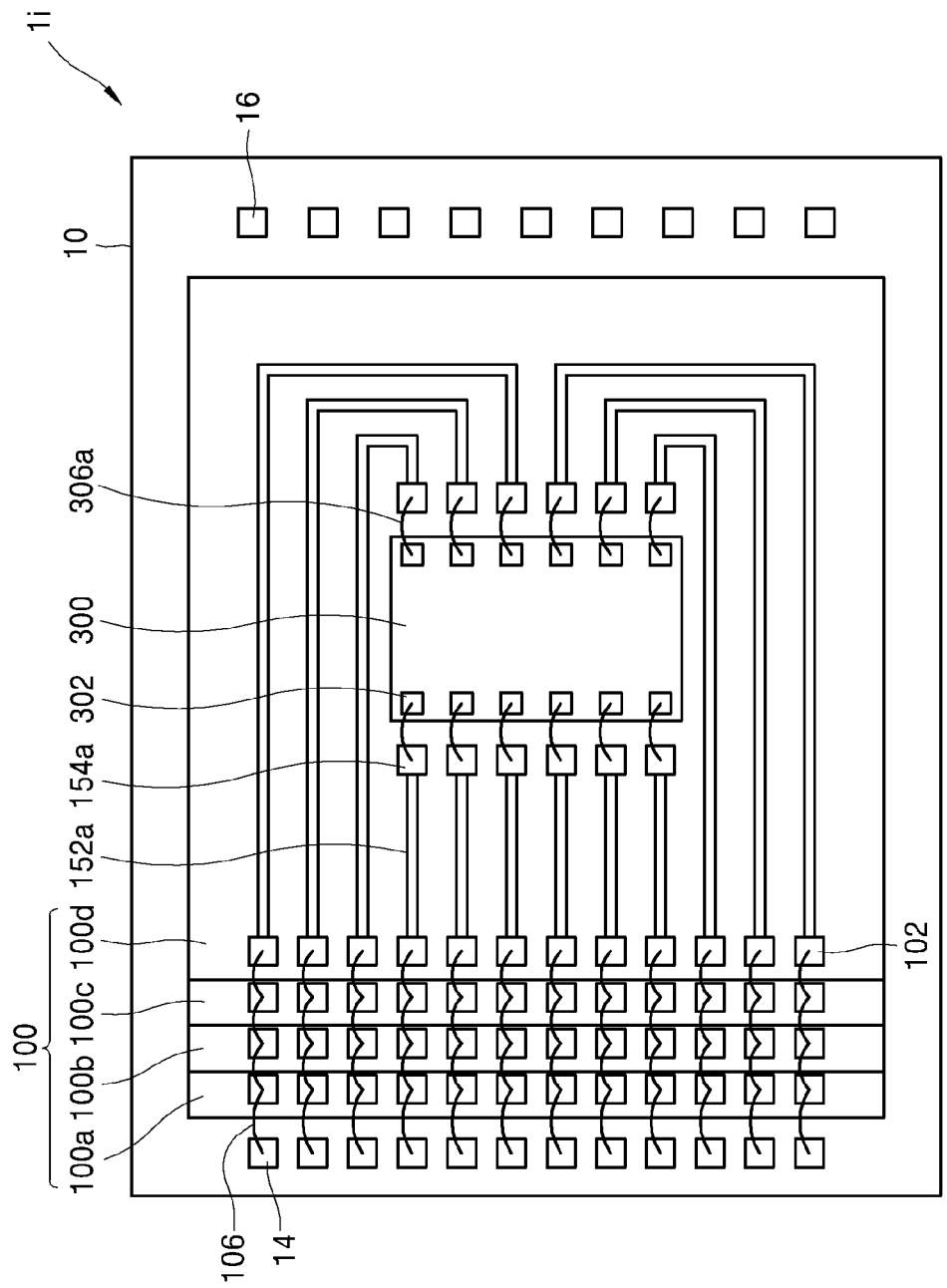
FIG. 16 is a plan view illustrating a process before a second semiconductor chip unit is stacked on the semiconductor package according to the embodiment of FIG. 15.

FIG. 15 is a cross-sectional view illustrating an aspect of a semiconductor package according to an embodiment. FIG. 16 is a plan view illustrating a process before a second semiconductor chip unit is stacked on the semiconductor package according to the embodiment of FIG. 15.

Referring to FIGS. 15 and 16, in a semiconductor package 1i, first rewiring line pads 154a are formed at one ends of rewiring line patterns 152a and the other ends of the rewiring line patterns 152a are connected to first pads 102 of an uppermost first semiconductor chip 100d. Therefore, the third semiconductor chip 300 may be connected to first semiconductor chips 100a, 100b, 100c, and 10d without a base substrate 10. Therefore, the semiconductor package 1i illustrated in FIGS. 15 and 16 may not include the third connection pad 18a and the third bonding wire 306b unlike the semiconductor package 1e illustrated in FIGS. 7 and 8.

Figure 17:
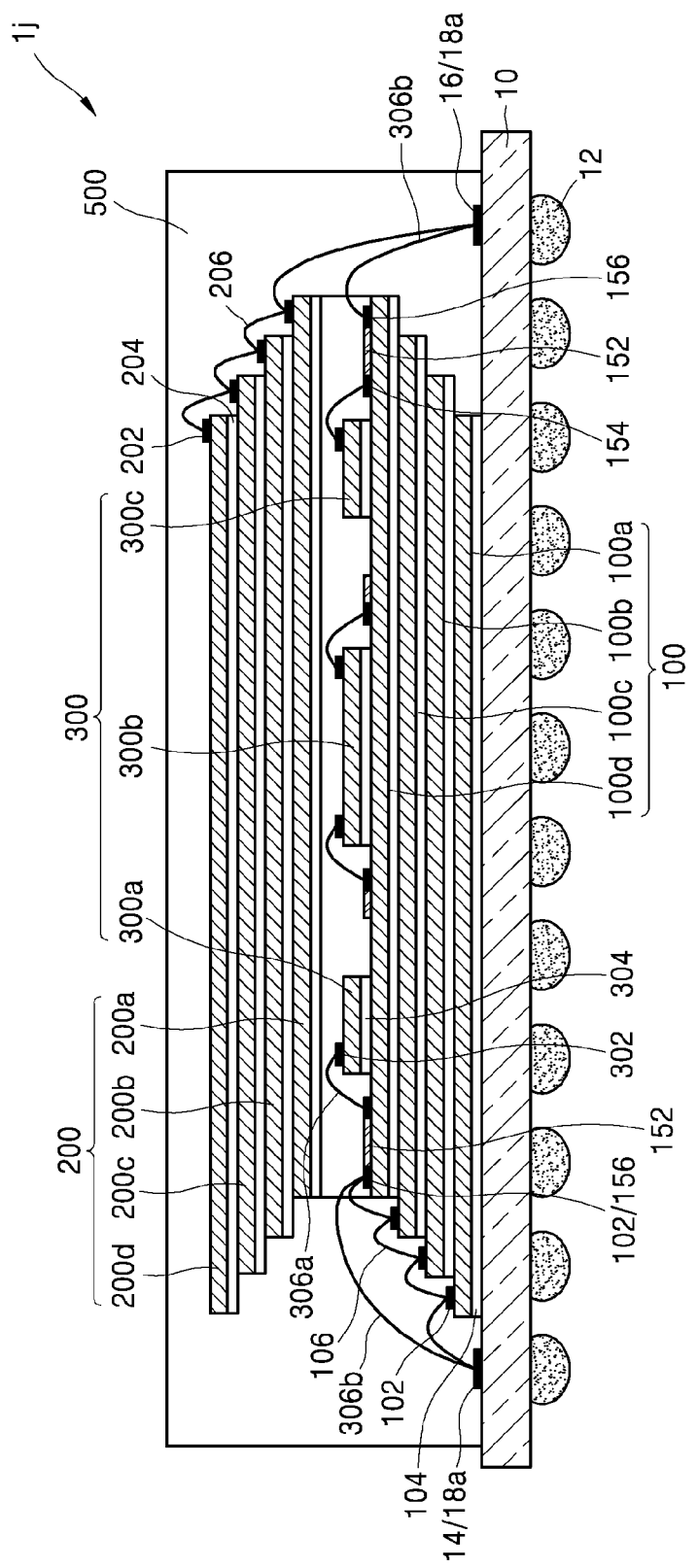
FIG. 17 is a cross-sectional view illustrating an aspect of a semiconductor package according to an embodiment.

FIG. 17 is a cross-sectional view illustrating an aspect of a semiconductor package according to an embodiment. Referring to FIG. 17, a semiconductor package 1j includes multiple third semiconductor chips 300. In particular, the semiconductor package 1j includes third semiconductor chips 300a, 300b, and 300c. The third semiconductor chips 300a, 300b, and 300c may be attached to different portions of an upper surface of an uppermost first semiconductor chip 100d without being stacked.

It is illustrated that rewiring line patterns 152 are used for connecting the third semiconductor chips 300a, 300b, and 300c and a base substrate 10 like in the semiconductor package be illustrated in FIG. 7. However, embodiments are not limited to the above and the methods of connecting the third semiconductor chip 300 and the base substrate 10, which are illustrated in the semiconductor packages 1a, 1b, 1c, 1d, 1f, 1g, 1h, and 1i of FIGS. 1, 2, 3, 5, 9, 11, 13, and 15, may be used.

Figure 18:
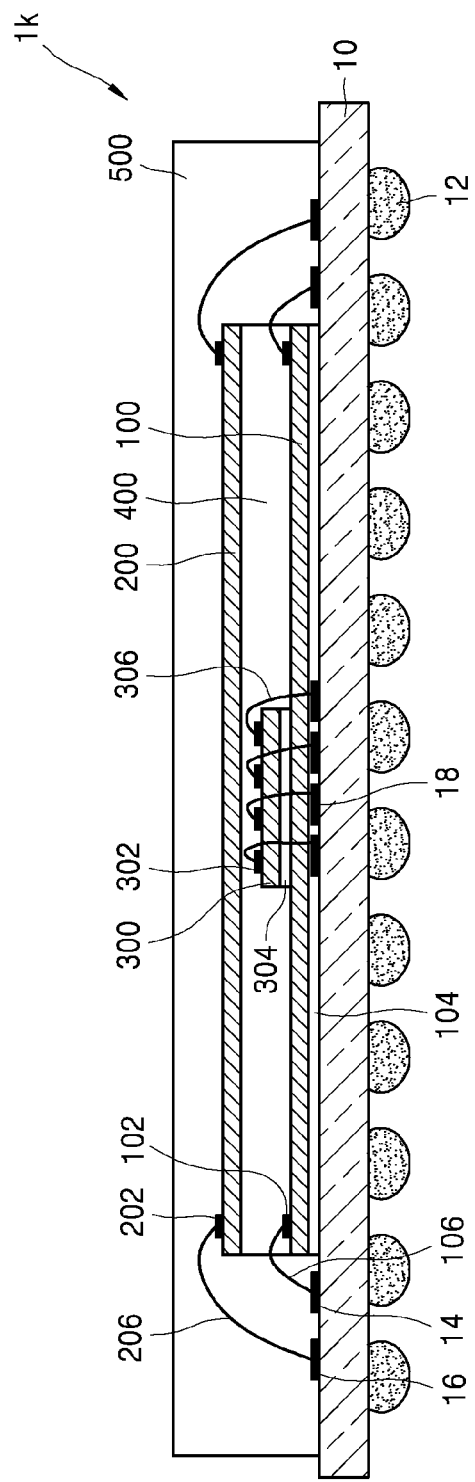
FIG. 18 is a cross-sectional view illustrating an aspect of a semiconductor package according to an embodiment.

FIG. 18 is a cross-sectional view illustrating an aspect of a semiconductor package according to an embodiment. Referring to FIG. 18, in a semiconductor package 1k, a first semiconductor chip unit 100 and a second semiconductor chip unit 200 are attached onto a base substrate 10 to be vertically stacked. An insulating material layer 400 may function as a die adhesive film between the first semiconductor chip unit 100 and the second semiconductor chip unit 200. A first semiconductor chip included in the first semiconductor chip unit 100 and a second semiconductor chip included in the second semiconductor chip unit 200 may have the same area.

In FIG. 18, it is illustrated that each of the first semiconductor chip unit 100 and the second semiconductor chip unit 200 is formed of one semiconductor chip. However, the inventive concept is not limited to the above. In the first semiconductor chip unit 100 and the second semiconductor chip unit 200, multiple first semiconductor chips and multiple second semiconductor chips may be vertically stacked, respectively. In this case, the first semiconductor chips may be stacked so that edges thereof coincide with each other in a direction vertical to the base substrate 10. In addition, the second semiconductor chips may be stacked so that edges thereof coincide with each other in the direction vertical to the base substrate 10. Furthermore, the first semiconductor chips and the second semiconductor chips may be stacked so that edges coincide with each other in the direction vertical to the base substrate 10.

First bonding wires 106 and/or second bonding wires 206 may connect first pads 102 and/or second pads 202 and first connection pads 14 and second connection pads 16 without another first semiconductor chip and/or second semiconductor chip. Third bonding wire 306 may connect third pads 302 and third connection pads 18. The third connection pads 18 may be formed to be adjacent to a different side surface from that of the base substrate 10 to which the first pads 102 and/or the second pads 202 are adjacent.

Figure 19:
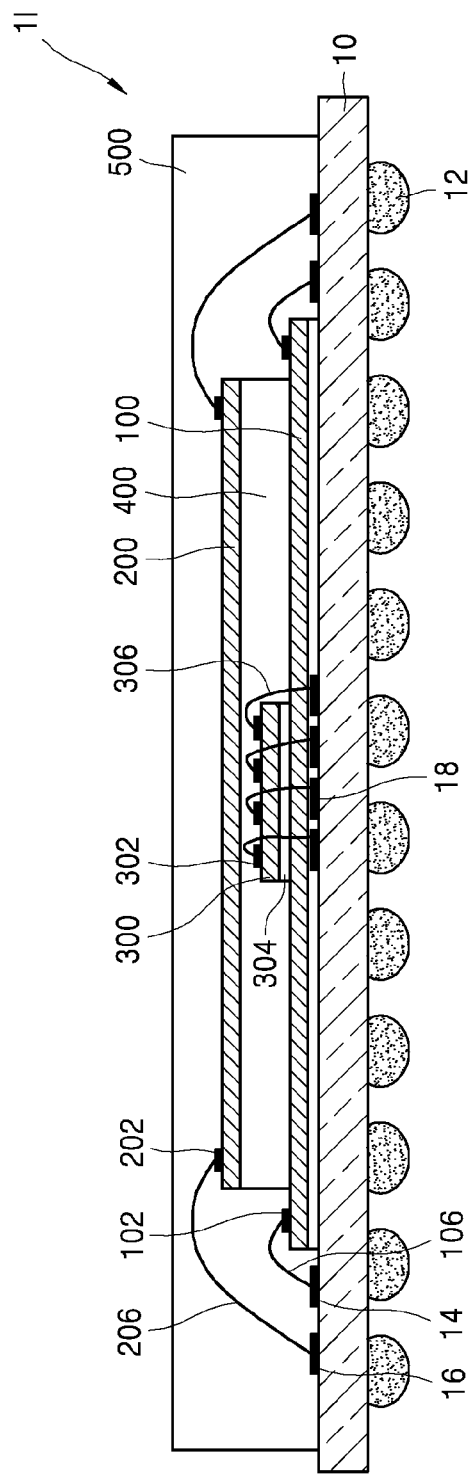
FIG. 19 is a cross-sectional view illustrating an aspect of a semiconductor package according to an embodiment.

FIG. 19 is a cross-sectional view illustrating an aspect of a semiconductor package according to an embodiment. In description of a semiconductor package 1l illustrated in FIG. 19, description of content similar to that of the semiconductor package 1k illustrated in FIG. 18 may be omitted.

Referring to FIG. 19, in the semiconductor package 1l, a first semiconductor chip unit 100 and a second semiconductor chip unit 200 are attached onto a base substrate 10 to be vertically stacked. When an area of a second semiconductor chip included in the second semiconductor chip unit 200 is smaller than that of a first semiconductor chip included in the first semiconductor chip unit 100, the second semiconductor chip unit 200 may be attached onto the first semiconductor chip unit 100 so that an edge of an upper surface thereof is spaced apart from that of an upper surface of the first semiconductor chip unit 100 in a direction vertical to the base substrate 10.

Figure 20:
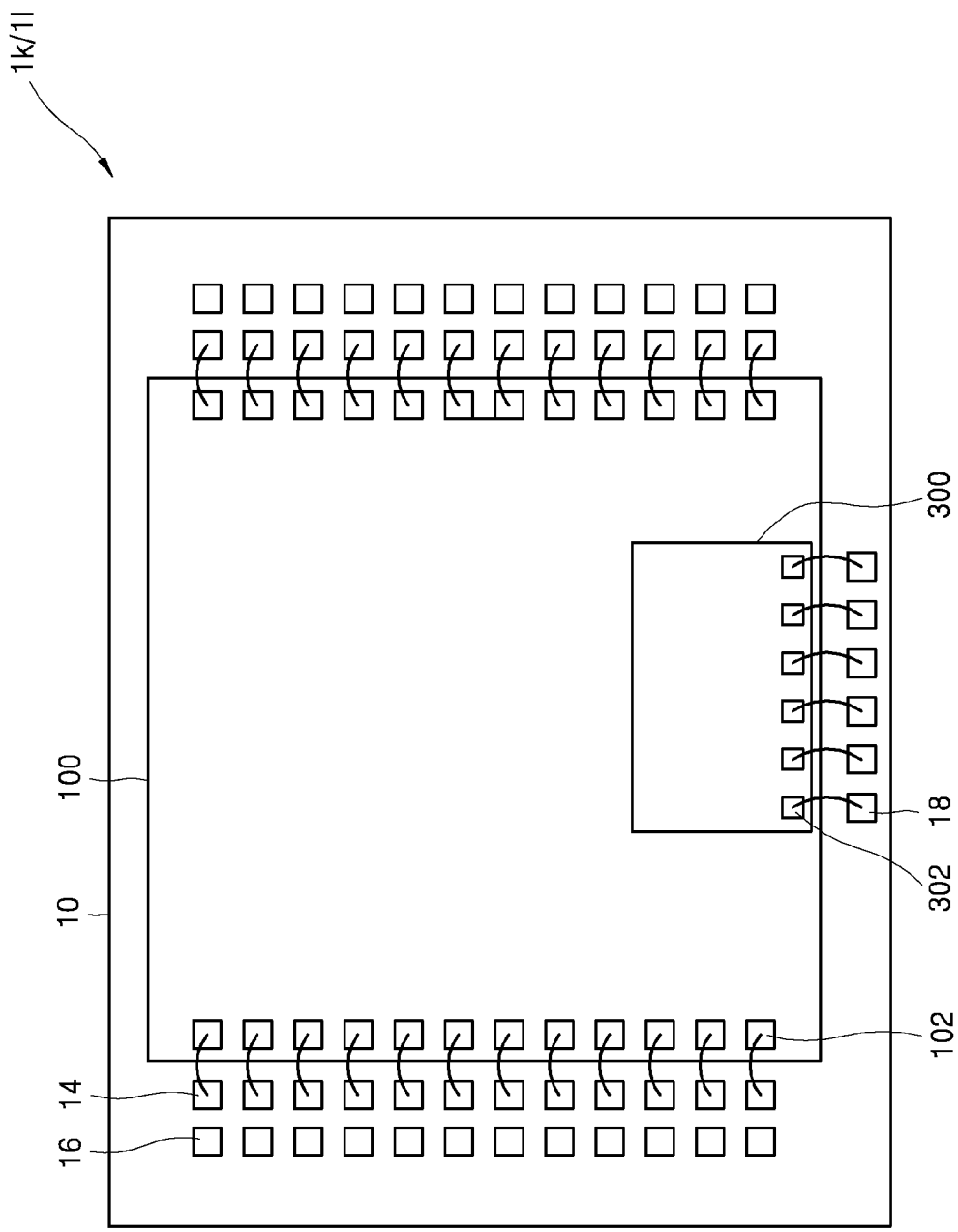
FIG. 20 is a plan view illustrating a process before a second semiconductor chip unit is stacked on the semiconductor package according to the embodiments of FIGS. 18 and 19.

FIG. 20 is a plan view illustrating a process before a second semiconductor chip unit is stacked on the aspects of the semiconductor package according to the embodiments of FIGS. 18 and 19.

Referring to FIG. 20, when first connection pads 14 and second connection pads 16 of the semiconductor package 1k/1l are adjacent to side surfaces of the first semiconductor chip unit 100, the third connection pads 18 may be formed to be adjacent to the another side surface of the first semiconductor chip unit 100.

Such an arrangement of the first to third connection pads 14, 16, and 18 exemplarily illustrates a difference in wire bonding method between the semiconductor package 1a obtained by the step stacking method illustrated in FIG. 1 and the semiconductor package 1k/1l obtained by the vertical stacking method illustrated in FIGS. 18 and 19.

FIGS. 21 to 26 are cross-sectional views illustrating processes of a method of manufacturing an aspect of a semiconductor package according to an embodiment. Specifically, FIGS. 21 to 26 are cross-sectional views illustrating processes of a method of manufacturing the semiconductor package 1a illustrated in FIG. 1.

Referring to FIG. 21, a base substrate 10 is provided. The base substrate 10 may be a printed circuit board (PCB) or other substrate as described above. The base substrate 10 may include epoxy resin, polyimide resin, bismaleimide triazine (BT) resin, flame retardant 4 (FR-4), FR-5, ceramic, silicon, glass, or the like. However, embodiments are not limited to the above. The base substrate 10 may be a single layer or may include a multilayer structure including wiring line patterns. For example, the base substrate 10 may be one rigid flat plate, may be formed by multiple rigid flat plates adhering to each other, or may be formed by thin flexible substrates and rigid flat plates adhering to each other. The rigid flat plates or the flexible substrates that adhere to each other may include wiring line patterns, respectively.

The external connection terminals 12 may be formed on the lower surface of the base substrate 10 and the connection pads 14, 16, and 18 may be formed on the upper surface of the base substrate 10. The external connection terminals 12 may be, for example, solder balls. The connection pads 14, 16, and 18 may be electrically connected to the external connection terminals 12 through the inside of the base substrate 10. The external connection terminals 12 may be attached to the base substrate 10 in providing the base substrate 10. However, the inventive concept is not limited to the above and the external connection terminals 12 may be attached to the base substrate 10 in a subsequent process, for example, after forming the mold layer 500 illustrated in FIG. 1.

Referring to FIG. 22, the first semiconductor chip unit 100 and the third semiconductor chip 300 are stacked on the base substrate 10. The first semiconductor chip unit 100 may include the first semiconductor chips 100a, 100b, 100c, and 100d. The first semiconductor chips 100a, 100b, 100c, and 100d may include the first pads 102 on the upper surfaces thereof, respectively. The first semiconductor chips 100a, 100*b*, 100*c*, and 100*d* may be attached onto the base substrate 10 by the first die adhesive films 104, respectively. The first semiconductor chips 100*a*, 100*b*, 100*c*, and 100*d* may be sequentially stacked on the base substrate 10 in the vertical direction. The first semiconductor chips 100*a*, 100*b*, 100*c*, and 100*d* may be stacked so that the active surfaces thereof face the opposite a direction towards the base substrate 10. The first semiconductor chips 100*a*, 100*b*, 100*c*, and 100*d* may be sequentially stacked on the base substrate 10 after the first die adhesive films 104 are previously attached to the lower surfaces thereof.

The first semiconductor chips 100*a*, 100*b*, 100*c*, and 100*d* may be shifted in the first direction by the predetermined distance to be stacked so that the upper surfaces thereof are at least partially exposed, respectively. The first direction may be horizontal to the main surface of the base substrate 10. The first semiconductor chips 100*a*, 100*b*, 100*c*, and 100*d* may be shifted in the first direction to be stacked so that portions of the upper surfaces thereof, in which the first pads 102 are formed, are exposed, respectively.

The third semiconductor chip 300 may be stacked on the uppermost first semiconductor chip 100*d*. The third semiconductor chip 300 may be stacked so that the active surface thereof faces the direction opposite to the base substrate 10. The third semiconductor chip 300 may have a smaller area than that of each of the first semiconductor chips 100*a*, 100*b*, 100*c*, and 100*d*. In particular, the third semiconductor chip 300 may have a smaller area than that of the uppermost first semiconductor chip 100*d*. The third semiconductor chip 300 may be attached onto the uppermost first semiconductor chip 100*d* to overlap the whole uppermost first semiconductor chip 100*d* in the direction vertical to the base substrate 10.

The third semiconductor chip 300 may include the third pad 302. The third semiconductor chip 300 may be attached onto the uppermost first semiconductor chip 100*d* by the third die adhesive film 304.

Referring to FIG. 23, the first bonding wire 106 and the third bonding wire 306 are formed. The first bonding wire 106 may be connected to the first connection pad 14 of the base substrate 10 after sequentially connecting the first pads 102 and the uppermost first semiconductor chip 100*d* to the lowermost first semiconductor chip 100*a*. However, embodiments are not limited to the above and the first bonding wire 106 may separately connect the first pads 102 of the first semiconductor chips 100*a*, 100*b*, 100*c*, and 100*d* to the first connection pad 14 of the base substrate 10.

The third bonding wire 306 may connect the third pad 302 and the third connection pad 18 of the base substrate 10.

Referring to FIG. 24, the second semiconductor chip 200*a* is stacked on the third semiconductor chip 100 and the third semiconductor chip 300. The second die adhesive film 204 and the insulating material layer 400 may be attached to the lower surface of the second semiconductor chip 200*a*. The insulating material layer 400 may surround at least a portion of the third semiconductor chip 300. The insulating material layer 400 may cover both the upper and side surfaces of the third semiconductor chip 300. In addition, the insulating material layer 400 may entirely or at least partially cover a portion to which the third semiconductor chip 300 is not attached in the upper surface of the uppermost first semiconductor chip 100*d*.

The insulating material layer 400 may be formed on the first semiconductor chip 100 and the third semiconductor chip 300 to surround at least a portion of the third semiconductor chip 300. The second semiconductor chip 200*a* to whose lower surface the second die adhesive film 204 is attached may be stacked on the insulating material layer 400.

Figure 25:
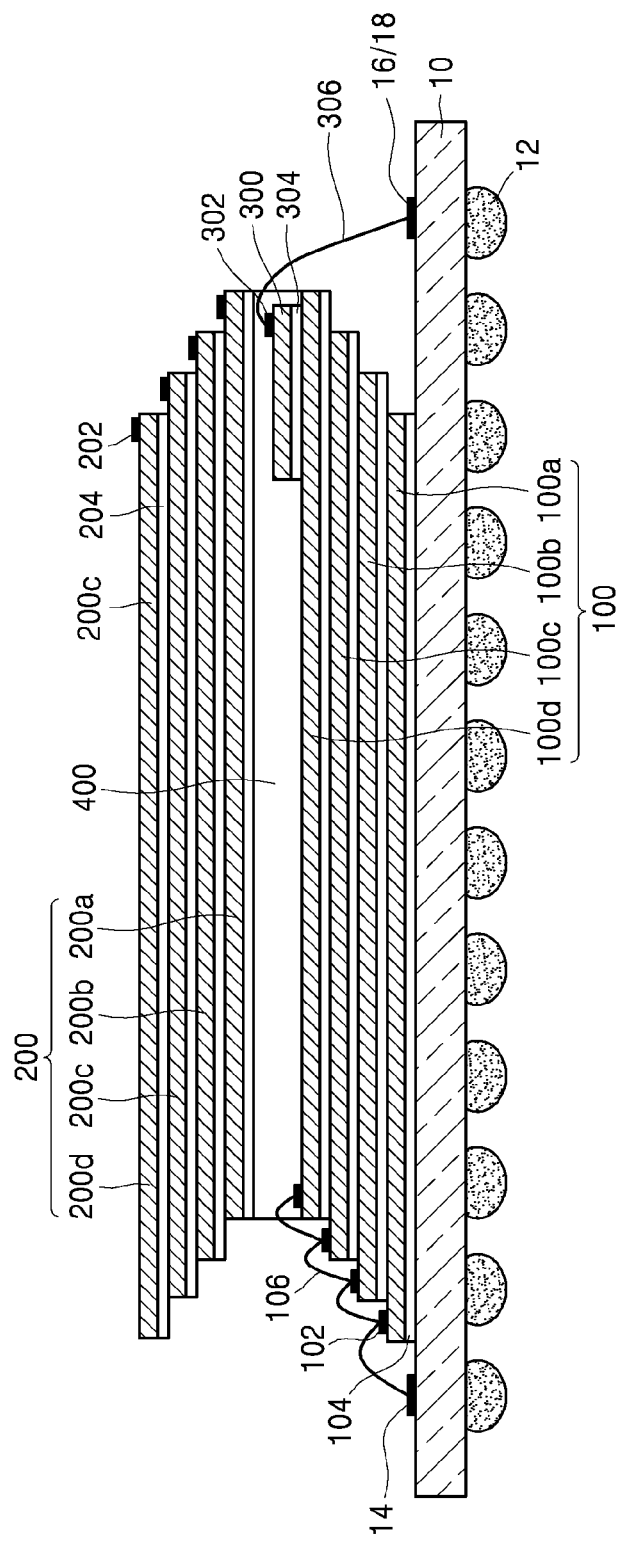

Referring to FIG. 25, the additional second semiconductor chips 200*b*, 200*c*, and 200*d* are sequentially stacked on the lowermost second semiconductor chip 200*a*. The second semiconductor chips 200*b*, 200*c*, and 200*d* may be stacked on the lowermost second semiconductor chip 200*a* by the second die adhesive films 204, respectively.

The second semiconductor chips 200*a*, 200*b*, 200*c*, and 200*d* may each include second pads 202. The second semiconductor chips 200*a*, 200*b*, 200*c*, and 200*d* may be stacked so that the active surfaces thereof face the direction opposite to the base substrate 10.

Figure 26:
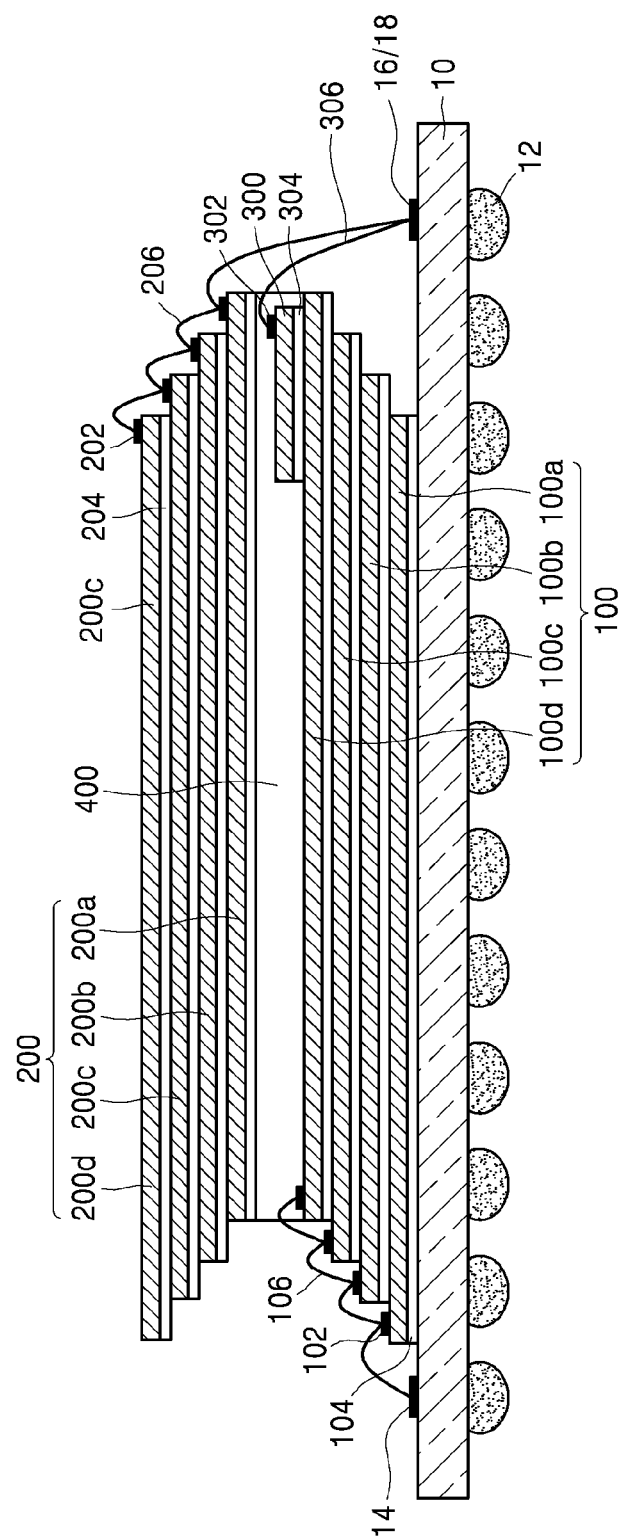

Referring to FIG. 26, the second bonding wire 206 is formed. The second bonding wire 206 may be connected to the second connection pad 16 of the base substrate 10 after sequentially connecting the second pads 202 and the uppermost second semiconductor chip 200*d* to the lowermost second semiconductor chip 200*a*. However, embodiments are not limited to the above and the second bonding wire 206 may separately connect the second pads 202 of the second semiconductor chips 200*a*, 200*b*, 200*c*, and 200*d* to the second connection pad 16 of the base substrate 10.

Then, the encapsulation layer 500 is formed as illustrated in FIG. 1 so that the semiconductor package 1*a* may be formed.

Only a difference in the methods of manufacturing the semiconductor packages 1*b*, 1*c*, 1*d*, 1*e*, 1*f*, 1*g*, 1*h*, 1*i*, and 1*j* illustrated in FIGS. 2, 3, 5, 7, 9, 11, 13, 15, and 17 will be described and substantially similar content will be omitted.

The semiconductor packages 1*b* and 1*c* illustrated in FIGS. 2 and 3 may be formed by a similar method to that illustrated in FIGS. 21 to 26.

The semiconductor package 1*d* illustrated in FIG. 5 may be formed so that the first semiconductor chips 110*a*, 110*b*, 110*c*, and 110*d* are vertically stacked on the base substrate 10 and are connected to the base substrate 10 by the through electrodes 112 and the bumps 114.

The semiconductor packages 1*e*, 1*g*, 1*h*, and 1*i* illustrated in FIGS. 7, 11, 13, and 15 may be formed by forming the rewiring line patterns 152 on the upper surface of the uppermost first semiconductor chip 100*d* and stacking the rewiring line patterns 152 on the base substrate 10.

The semiconductor package 1*f* illustrated in FIG. 9 may be formed by attaching the third semiconductor chip 310 onto the uppermost first semiconductor chip 100*d* by the flip-chip method.

The semiconductor package 1*j* illustrated in FIG. 17 may be formed by attaching the third semiconductor chips 300*a*, 300*b*, and 300*c* onto the upper surface of the uppermost first semiconductor chip 100*d*.

FIGS. 27 to 30 are cross-sectional views illustrating processes of a method of manufacturing an aspect of a semiconductor package according to an embodiment. Specifically, FIGS. 27 to 30 are cross-sectional views illustrating the processes of the method of manufacturing the semiconductor package 1*k* illustrated in FIG. 18.

Figure 27:
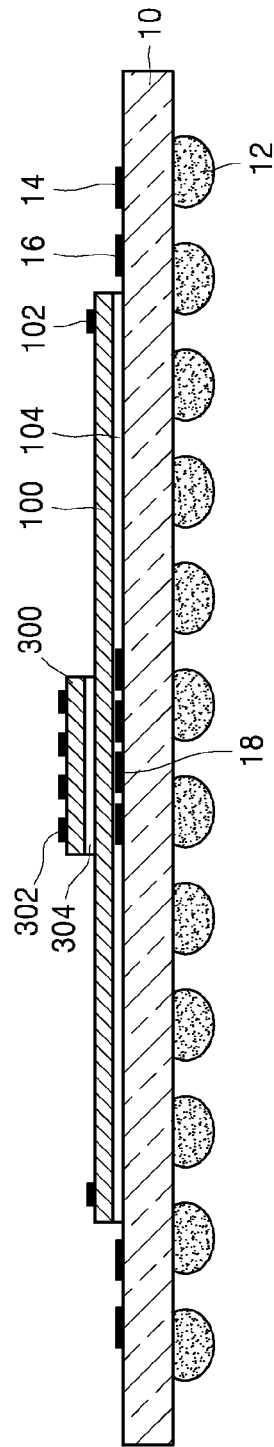

Referring to FIG. 27, the first semiconductor chip unit 100 and the third semiconductor chip 300 are vertically stacked on the base substrate 10.

When the first semiconductor chip unit 100 includes multiple first semiconductor chips, the first semiconductor chips may be stacked so that the edges thereof coincide with each other in the direction vertical to the base substrate 10.

Figure 28:
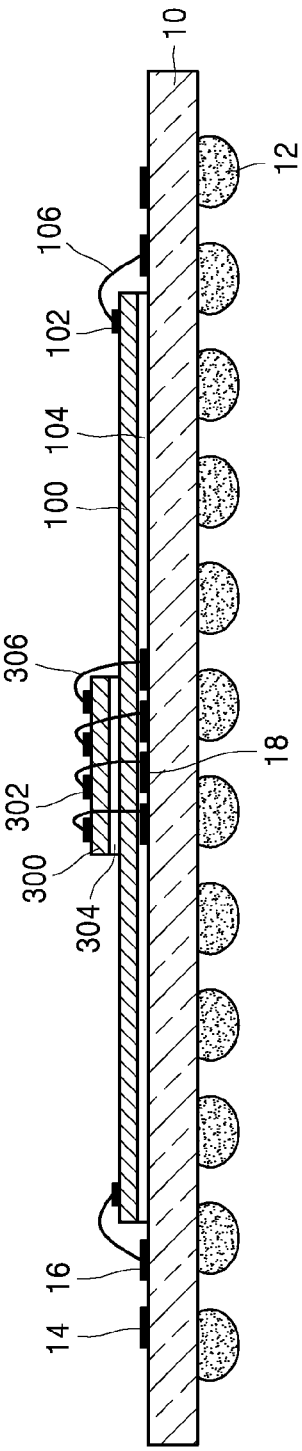

Referring to FIG. 28, the first bonding wire 106 for connecting the first semiconductor chip unit 100 and the base substrate 10 and the third bonding wire 306 for connecting the third semiconductor chip 300 and the base substrate 10 are formed.

Referring to FIG. 29, the second semiconductor chip unit 200 is stacked on the first semiconductor chip unit 100 and the third semiconductor chip 300. The second semiconductor chip unit 200 is attached on the base substrate 10 to be stacked in the direction vertical to the first semiconductor chip unit 100. The insulating material layer 400 may function as the die adhesive film between the first semiconductor chip unit 100 and the second semiconductor chip unit 200.

When the area of the first semiconductor chip included in the first semiconductor chip unit 100 is substantially the same as that of the second semiconductor chip included in the second semiconductor chip unit 200, the first semiconductor chip unit 100 and the second semiconductor chip unit 200 may be stacked so that the edges thereof coincide with each other in the direction vertical to the base substrate 10.

When the second semiconductor chip unit 200 includes the second semiconductor chips, the second semiconductor chips may be stacked so that the edges thereof coincide with each other in the direction vertical to the base substrate 10.

Referring to FIG. 30, the second bonding wire 206 for connecting the second semiconductor chip unit 200 and the base substrate 10 is formed. Then, the encapsulation layer 500 is formed as illustrated in FIG. 18 so that the semiconductor package 1k may be formed.

The semiconductor package 1l illustrated in FIG. 19 may be formed by a similar method to that illustrated in FIGS. 27 to 30. When the area of the second semiconductor chip included in the second semiconductor chip unit 200 is smaller than that of the first semiconductor chip included in the first semiconductor chip unit 100, the second semiconductor chip unit 200 may be attached onto the first semiconductor chip unit 100 so that the edge of the upper surface of the second semiconductor chip unit 200 is spaced apart from that of an upper surface of the first semiconductor chip unit 100 in a direction vertical to the base substrate 10.

Figure 31:
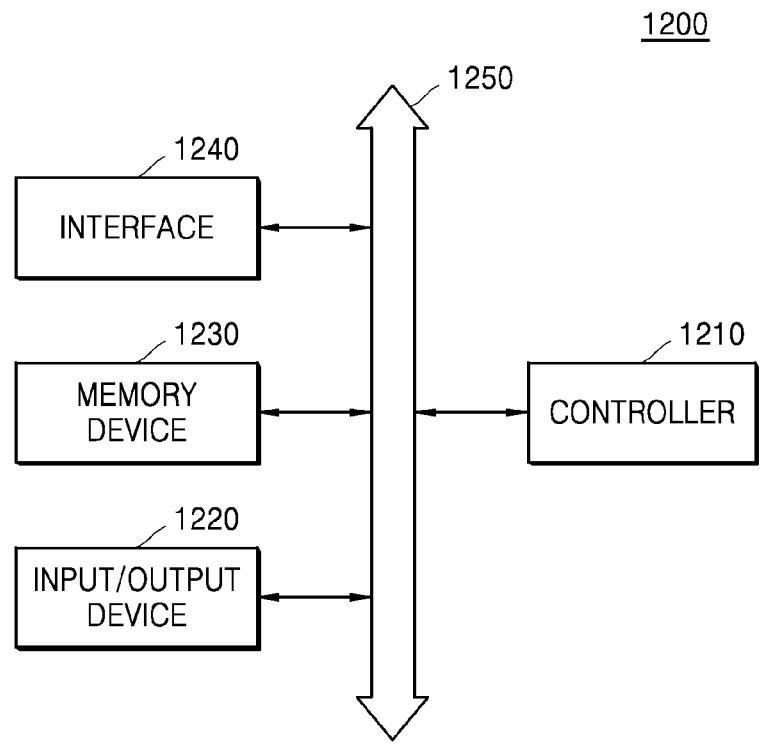
FIG. 31 is a block diagram illustrating a system including a semiconductor package according to an embodiment.

FIG. 31 is a block diagram illustrating a system including a semiconductor package according to an embodiment. A system 1200 includes a controller 1210, an input/output device 1220, a memory device 1230, and an interface 1240. The system 1200 may be a mobile system or a system for transmitting or receiving information. In some embodiments, the mobile system is a personal digital assistant (PDA), a portable computer, a web tablet, a wireless phone, a mobile phone, a digital music player, a memory card, or the like. The controller 1210 may be configured to control an execution program in the system 1200 and may include a microprocessor, a digital signal processor, a microcontroller, or a similar device. The input/output device 1220 may be configured to input and/or output data to and from the system 1200. The system 1200 may be connected to an external device, for example, a personal computer (PC) or a network by using the input/output device 1220 and may exchange data with the external device. The input/output device 1220 may include, for example, a keypad, a keyboard, a display, or the like.

The memory device 1230 may store a code and/or data for operating the controller 1210 or may store data processed by the controller 1210. The memory device 1230 includes the semiconductor package according to the embodiment. For example, the memory device 1230 may include the semiconductor packages 1a, 1b, 1c, 1d, 1e, 1f, 1g, 1h, 1i, 1j, 1k, and 1l illustrated in FIGS. 1 to 20.

The interface 1240 may be a transmission channel between the system 1200 and another external device. The controller 1210, the input/output device 1220, the memory device 1230, and the interface 1240 may communicate with each other through a bus 1250. The system 1200 may be used for a mobile phone, an MP3 player, a navigator, a portable multimedia player (PMP), a solid state disk (SSD), or household appliances.

Figure 32:
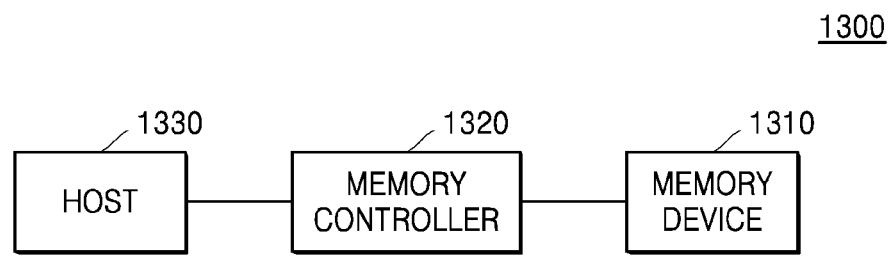
FIG. 32 is a block diagram illustrating a memory card including a semiconductor package according to an embodiment.

FIG. 32 is a block diagram illustrating a memory card including a semiconductor package according to an embodiment. A memory card 1300 includes a memory device 1310 and a memory controller 1320. The memory device 1310 may be configured to store data. In some embodiments, the memory device 1310 has a non-volatile characteristic in which stored data may be maintained although power supply is stopped. The memory device 1310 includes the semiconductor package according to the inventive concept. For example, the memory device 1310 may include the semiconductor packages 1a, 1b, 1c, 1d, 1e, 1f, 1g, 1h, 1i, 1j, 1k, and 1l illustrated in FIGS. 1 to 20.

The memory controller 1320 may be configured to read data stored in the memory device 1310 or store the data of the memory device 1310 in response to a read/write request of a host 1330. In other embodiments, the memory controller 1320 and/or the host 1330 may include a semiconductor package as described herein.

An embodiment includes a semiconductor package capable of minimizing a volume thereof and reducing a length of an electrical path therein to prevent a characteristic thereof from being deteriorated.

According to an embodiment, a semiconductor package includes a base substrate, a first semiconductor chip unit attached onto the base substrate and including at least one first semiconductor chip, a second semiconductor chip unit including at least one second semiconductor chip stacked on the first semiconductor chip unit, at least one third semiconductor chip disposed between the first semiconductor chip unit and the second semiconductor chip unit and having a smaller area than that of the at least first semiconductor chip and that of the at least one second semiconductor chip, and an insulating material layer disposed between the first semiconductor chip unit and the second semiconductor chip unit to surround at least a portion of the at least one third semiconductor chip and having a larger thickness than that of the third semiconductor chip.

The insulating material layer may have substantially the same area as that of the second semiconductor chip adjacent to the insulating material layer on the insulating material layer.

Edges of the insulating material layer and the second semiconductor chip adjacent to the insulating material layer on the insulating material layer may coincide with each other in a direction vertical to the base substrate.

The first semiconductor chip unit may include the first semiconductor chips shifted in a first direction by a predetermined distance to be stacked so that upper surfaces thereof are at least partially exposed.

The second semiconductor chip unit may include the second semiconductor chips shifted in a second direction different from the first direction by a predetermined distance to be stacked so that upper surfaces thereof are at least partially exposed.

The second semiconductor chips may be stacked on the base substrate by die adhesive films attached to lower surfaces thereof and the insulating material layer may have a larger thickness than that of the die adhesive film.

Edges of first and second semiconductor chips adjacent to lower and upper surfaces of the insulating material layer may coincide with each other in a direction vertical to the base substrate among the first and second semiconductor chips.

A rewiring line pattern may be formed on an upper surface of the first semiconductor chip adjacent to the insulating material layer under the insulating material layer and the at least one third semiconductor chip may be electrically connected to the rewiring pattern.

The at least one third semiconductor chip may be electrically connected to the first semiconductor chip through the rewiring line pattern.

The at least one third semiconductor chip may be electrically connected to the base substrate by a bonding wire for connecting the rewiring line pattern and the base substrate.

The at least one third semiconductor chip may be electrically connected to the rewiring line pattern by a flip-chip method using bumps and a wire bonding method using a bonding wire.

The at least one third semiconductor chip may be electrically connected to the base substrate by a wire bonding method using a bonding wire.

Both upper and side surfaces of the at least one third semiconductor chip may be surrounded by the insulating material layer.

The at least one third semiconductor chip may protrude from one side surfaces of the insulating material layer and the second semiconductor chip adjacent to the insulating material layer on the insulating material layer so that one side surface thereof is exposed.

According to another embodiment, a semiconductor package includes a base substrate, at least two semiconductor chips stacked on the base substrate by die adhesive films attached to lower surfaces thereof, an adhesive material layer disposed between the stacked at least two semiconductor chips and having substantially the same area as that of the semiconductor chip adjacent to the adhesive material layer on the adhesive material layer and a larger thickness than that of the die adhesive film, and an auxiliary semiconductor chip at least a portion thereof is surrounded by the adhesive material layer to be disposed between the stacked at least two semiconductor chips and having a smaller area than that of the at least two semiconductor chips.

While the inventive concept has been particularly shown and described with reference to exemplary embodiments thereof, it will be understood that various changes in form and details may be made therein without departing from the spirit and scope of the following claims.

What is claimed is:

1. A semiconductor package comprising:
   a base substrate;
   a first semiconductor chip unit attached to the base substrate and including at least one first semiconductor chip;
   a second semiconductor chip unit stacked on the first semiconductor chip unit and including at least one second semiconductor chip;
   at least one third semiconductor chip disposed between the first semiconductor chip unit and the second semiconductor chip unit, the at least one third semiconductor chip having an area smaller than that of the at least one first semiconductor chip and that of the at least one second semiconductor chip and having a pad;
   an insulating material layer disposed between the first semiconductor chip unit and the second semiconductor chip unit to surround at least a portion of the at least one third semiconductor chip and having a thickness larger than that of the third semiconductor chip;
   a rewiring line pattern formed on an upper surface of the at least one first semiconductor chip closest to the insulating material layer and formed under the insulating material layer;
   an auxiliary bonding wire connecting the pad of the at least one third semiconductor chip to the rewiring line pattern; and
   a bonding wire connecting the rewiring line pattern to the base substrate.

2. The semiconductor package of claim 1,
   wherein the insulating material layer has substantially the same area as that of a second semiconductor chip of the second semiconductor chip unit that is closest to the insulating material layer.

3. The semiconductor package of claim 2,
   wherein edges of the insulating material layer and the second semiconductor chip closest to the insulating material layer coincide with each other in a direction perpendicular to the base substrate.

4. The semiconductor package of claim 1,
   wherein the at least one first semiconductor chip comprises a plurality of first semiconductor chips stacked so that upper surfaces of the first semiconductor chips are at least partially exposed.

5. The semiconductor package of claim 4,
   wherein the at least one second semiconductor chip comprises a plurality of second semiconductor chips stacked so that upper surfaces thereof are at least partially exposed and shifted in a direction different from that of the first semiconductor chips.

6. The semiconductor package of claim 5,
   wherein the second semiconductor chips are stacked on the base substrate by die adhesive films attached to respective lower surfaces; and
   the thickness of the insulating material layer is larger than that of the die adhesive film.

7. The semiconductor package of claim 5,
   wherein edges of first and second semiconductor chips closest to the insulating material layer coincide with each other in a direction perpendicular to the base substrate.

8. The semiconductor package of claim 1, wherein:
   the first semiconductor chips are vertically aligned; and
   the second semiconductor chips are horizontally offset.

9. The semiconductor package of claim 1, wherein the at least one third semiconductor chip is electrically connected to the first semiconductor chip through the rewiring line pattern.

10. The semiconductor package of claim 1,
    wherein the at least one third semiconductor chip is electrically connected to the rewiring line pattern by a flip-chip method using bumps or a wire bonding method using a bonding wire.

11. The semiconductor package of claim 1, wherein both upper and side surfaces of the at least one third semiconductor chip are surrounded by the insulating material layer.

12. The semiconductor package of claim 1, wherein the at least one third semiconductor chip protrudes from a side surface of the insulating material layer and so that a side surface of the at least one third semiconductor chip is exposed.

13. The semiconductor package of claim 1, wherein:
    the at least one third semiconductor chip comprises a plurality of third semiconductor chips; and
    for each of the third semiconductor chips, the insulating material layer surrounds at least a portion of the third semiconductor chip.

14. The semiconductor package of claim 1,
wherein an area of the at least one first semiconductor chip is different from an area of the at least one second semiconductor chip.

15. The semiconductor package of claim 1, wherein:
the base substrate includes a plurality of first pads, a plurality of second pads, and a plurality of third pads;
the first pads are electrically connected to the first semiconductor chip unit;
the second pads are electrically connected to the second semiconductor chip unit;
the third pads are electrically connected to the at least one third semiconductor chip; and
the third pads are disposed on a side of the first semiconductor chip unit different from that of the first and second pads.

* * * * *